United States Patent
Sato

[11] Patent Number: 5,900,661
[45] Date of Patent: May 4, 1999

[54] EEPROM WITH BIT LINES BELOW WORD LINES

[75] Inventor: Yasuo Sato, Tokyo, Japan

[73] Assignee: Nippon Steel Corporation, Tokyo, Japan

[21] Appl. No.: 08/931,517

[22] Filed: Sep. 16, 1997

[30] Foreign Application Priority Data

Sep. 18, 1996 [JP] Japan .................................. 8-267843

[51] Int. Cl.⁶ ......................... H01L 29/788; G11C 11/34
[52] U.S. Cl. .................. 257/315; 257/321; 365/185.11; 365/185.13
[58] Field of Search ................... 257/315, 321; 365/185.13, 185.11

[56] References Cited

U.S. PATENT DOCUMENTS

| | | | |
|---|---|---|---|
| 4,760,554 | 7/1988 | Schreck | 365/185.13 |
| 5,399,891 | 3/1995 | Yiu | 257/315 |
| 5,641,989 | 6/1997 | Tomioka | 257/315 |
| 5,708,285 | 1/1998 | Otani | 257/315 |

FOREIGN PATENT DOCUMENTS 2-28379 of 1990 Japan .
8-235886 of 1996 Japan .

Primary Examiner—Jerome Jackson, Jr.
Attorney, Agent, or Firm—Pollock, Vande Sande & Amernick

[57] ABSTRACT

In a semiconductor device and a manufacturing method therefor, in a nonvolatile semiconductor memory such as an EEPROM having a floating gate, bit lines are formed under word lines to easily and properly realize bit contact, and a memory cell portion and a peripheral circuit portion are manufactured with good uniformity. In the memory cell portion of this nonvolatile semiconductor memory, a polysilicon film is patterned to form a gate counterelectrode and the bit lines substantially at the same level. The gate counterelectrode opposes a floating gate and is capacitively coupled to the floating gate with a dielectric film intervened therebetween on a field oxide film which is an element isolation structure. The word lines extend on an insulating film formed on the bit lines to cross the bit lines and are electrically connected to lower counterelectrodes. Therefore, the bit lines substantially exist under the word lines. The floating gate of the memory cell portion and the gate of the peripheral circuit portion, or the gate counterelectrode and the bit lines of the memory cell portion and the wiring layer of the peripheral circuit portion are simultaneously formed.

36 Claims, 25 Drawing Sheets

EEPROM WITH BIT LINES BELOW WORD LINES

BACKGROUND OF THE INVENTION

1. Field of the Invention

The present invention relates to a semiconductor device including memory cell region which has a composite gate structure consisting of a floating gate and a control gate and to a method of manufacturing the same.

2. Description of the Related Art

Along with recent multifunctioning of various portable electronic devices or home appliances, a technique of integrating, in a logic LSI represented by one-tip-microcomputer, a nonvolatile semiconductor memory which has an electric charge accumulation layer to hold stored data even after the power-OFF is becoming more important. The nonvolatile semiconductor memory uses, as the electric charge accumulation layer, a floating gate, a two-layer film (NO film) constituted by a nitride film and an oxide film, a three-layer film (ONO film) constituted by an oxide film, a nitride film and an oxide film, or the like. The nonvolatile semiconductor memory having a floating gate is represented by an EEPROM. The nonvolatile semiconductor memory having an NO film is called an MNOS transistor and the memory having an ONO film is called an MONOS transistor.

The nonvolatile semiconductor memory is developing into a multivalued memory which stores one of predetermined multivalued data of ternary or more. One instance of a multivalued EEPROM or MNOS transistor is disclosed in Japanese Patent Laid-Open No. 8-235886.

Generally, the memory cell structure of an EEPROM or the like has a floating gate and a control gate (word line), and a bit line is formed on this control gate with an insulating interlayer intervened therebetween.

However, with recent progress in micropatterning and integration of semiconductor devices, a contact hole formed to connect a bit line and a drain diffusion layer is required to be smaller in diameter. In this case, the aspect ratio of the contact hole becomes high because its diameter becomes small relative to its depth. Therefore, the requirement of position accuracy becomes stricter in formation of the contact hole. To relax this requirement of position accuracy, the aspect ratio of the contact hole must be made as low as possible.

Japanese Patent Laid-Open No. 2-28379 discloses a nonvolatile semiconductor memory in which the word line and the bit line are simultaneously formed using the same material. In this nonvolatile semiconductor memory, the word line and the bit line do not cross each other but are formed in parallel, thus substantially forming a single layer structure. With this structure, the depth of the contact hole formed for bit contact can have a small value, i.e., almost the same value as that of the thickness of a single insulating interlayer formed on the surface of the semiconductor substrate.

However, the nonvolatile semiconductor memory has the following problem. When the word line and the bit line are formed in parallel so as not to cross each other, a plurality of transistors electrically connected to one bit line through corresponding contact holes formed under this bit line are simultaneously selected in the operation of the nonvolatile semiconductor memory. For this reason, the nonvolatile semiconductor memory cannot be normally operated because of its memory cell array structure.

Even if the above problem can be avoided by some means, no decoders can be arranged in the periphery of the memory cell array of the nonvolatile semiconductor memory.

SUMMARY OF THE INVENTION

It is an object of the present invention to provide a semiconductor device in which a word line and a bit line are formed to cross each other to enable a normal operation, and the bit line is formed under the word line to easily and properly obtain bit contact, thereby coping with further micropatterning and higher integration.

It is another object of the present invention to provide a method of manufacturing a semiconductor device in which bit contact can be easily and properly obtained to be able to cope with further micropatterning and higher integration, and when, in formation of a memory cell region with a composite gate structure consisting of a floating gate and a control gate, a transistor having a single gate structure is to be formed in the peripheral circuit region of the memory cell region, the memory cell region and the peripheral circuit region can be manufactured with relatively good uniformity.

According to an aspect of the present invention, there is provided a semiconductor device comprising a first insulating film formed on a surface of a semiconductor substrate in an element formation region demarcated on the semiconductor substrate, a floating gate electrode patterned at least on the first insulating film in the element formation region, a second insulating film formed on the floating gate electrode and having an opening for exposing part of a surface of the floating gate electrode, a third insulating film covering at least the exposed surface of the floating gate electrode, a counterelectrode patterned to bury the opening, opposing the floating gate electrode, and capacitively coupled to the floating gate electrode with the third insulating film intervened therebetween, a first wiring layer formed on the second insulating film at a level corresponding to the counterelectrode and substantially consisting of the same material as that of the counterelectrode, a fourth insulating film formed to cover the first wiring layer and electrically disconnect the first wiring layer from the adjacent counterelectrode, and a second wiring layer stacked on the fourth insulating film and the counterelectrode to cross the first wiring layer with the fourth insulating film intervened therebetween and electrically connected to the counterelectrode.

According to another aspect of the present invention, there is provided a semiconductor device comprising a first insulating film formed on a surface of a semiconductor substrate in an element formation region demarcated on the semiconductor substrate, a floating gate electrode patterned at least on the first insulating film in the element formation region, a second insulating film formed on the floating gate electrode and having an opening for exposing part of a surface of the floating gate electrode, a third insulating film covering at least the exposed surface of the floating gate electrode, a counterelectrode filling in the opening, opposing the floating gate electrode, and capacitively coupled to the floating gate electrode with the third insulating film intervened therebetween, a first wiring layer patterned on the second insulating film, a fourth insulating film formed to cover the first wiring layer and electrically disconnect the first wiring layer from the adjacent counterelectrode, and a second wiring layer stacked on the fourth insulating film and the counterelectrode to cross the first wiring layer with the fourth insulating film intervened therebetween and electrically connected to the counterelectrode.

According to still another aspect of the present invention, there is provided a semiconductor device comprising a first conductive film patterned on a semiconductor substrate at least with a first insulating film intervened therebetween, a second conductive film patterned on the first conductive film with a second insulating film intervened therebetween and capacitively coupled to the first conductive film, a third conductive film patterned on the first conductive film at least with a third insulating film intervened therebetween and buried in a fourth insulating film to be close to the second conductive film with the fourth insulating film intervened therebetween, and a fourth conductive film patterned on the second conductive film and the fourth insulating film, electrically connected to the second conductive film, and crossing the third conductive film with the fourth insulating film intervened therebetween.

According to still another aspect of the present invention, there is provided a method of manufacturing a semiconductor device, comprising the first step of forming a first insulating film in an element region on a semiconductor substrate, the second step of patterning a first conductive film at least on the first insulating film, the third step of forming a second insulating film on the first conductive film, the fourth step of forming a first opening in the second insulating film to expose part of a surface of the first conductive film, the fifth step of forming a third insulating film at least on the first conductive film exposed in the first opening, the sixth step of forming a second conductive film on an entire surface including an upper surface of the second insulating film to a thickness for burying the first opening with the third insulating film intervened, the seventh step of patterning the second conductive film to leave the second conductive film into an island shape for burying the first opening and leave the second conductive film into a strip shape on the second insulating film, the eighth step of patterning a fourth insulating film for covering the second conductive film on the second insulating film, and the ninth step of patterning a third conductive film on the island-shaped second conductive film and the fourth insulating film so that the third conductive film crosses the strip-shaped second conductive film with the fourth insulating film intervened therebetween, and electrically connecting the third conductive film to the island-shaped second conductive film.

According to still another aspect of the present invention, there is provided a method of manufacturing a semiconductor device, comprising the first step of forming a first insulating film in an element region on a semiconductor substrate, the second step of patterning a first conductive film at least on the first insulating film, the third step of forming a second insulating film on the first conductive film, the fourth step of forming a first opening in the second insulating film to expose part of a surface of the first conductive film, the fifth step of forming a third insulating film at least on the first conductive film exposed in the first opening, the sixth step of forming a second conductive film in the first opening and on the second insulating film to bury the first opening with the third insulating film intervened, the seventh step of removing the second conductive film on the second insulating film using the second insulating film as a stopper and leaving the second conductive film to fill the first opening with the third insulating film intervened, the eighth step of patterning a third conductive film on the second insulating film, the ninth step of patterning a fourth insulating film to cover the third conductive film, and the tenth step of patterning a fourth conductive film on the second conductive film and the fourth insulating film such that the fourth conductive film crosses the third conductive film with the fourth insulating film intervened therebetween, and electrically connecting the fourth conductive film to the second conductive film.

According to still another aspect of the present invention, there is provided a semiconductor device having an element isolation structure formed in an element isolation region on a semiconductor substrate to demarcate an element formation region, comprising in the element formation region, an electric charge accumulation layer patterned over the semiconductor substrate, a pair of impurity diffusion layers formed in the semiconductor substrate to serve as source and drain, a first insulating interlayer formed over the semiconductor substrate including the electric charge accumulation layer and having a first opening, at least part of a bottom of the first opening being a surface of one of the pair of impurity diffusion layers, a bit line connected to one of the pair of impurity diffusion layers in the first opening, in the element isolation region, an extension portion extending over the element isolation structure, the electric charge accumulation layer formed in the element formation region having the extension portion, the first insulating interlayer having a second opening at least part of which is formed on the extension portion formed on the element isolation structure, in the second opening, a control gate electrode formed in the second opening formed in at least the first insulating interlayer oppose to the extension portion, a second insulating interlayer formed over the bit line and the first insulating layer, the second insulating interlayer having a third opening at least part of which is formed on the control gate electrode, and in the third opening, a word line connected to the control gate electrode formed to extend over the second insulating interlayer across the bit line with the second insulating interlayer intervened between the word line and bit line.

According to still another aspect of the present invention, there is provided a semiconductor device having an element isolation structure formed in an element isolation region on a semiconductor substrate to demarcate an element formation region, comprising in the element isolation region, a first electric charge accumulation layer formed on a first element isolation structure, a second electric charge accumulation layer formed on a second element isolation structure, the element formation region being formed in the semiconductor substrate between the first element isolation structure and the second element isolation structure, in the element formation region, a third electric charge accumulation layer patterned over the semiconductor substrate, the first and second electric charge accumulation layers being connected to each other through the third electric charge accumulation layer, a pair of impurity diffusion layers formed in the semiconductor substrate to serve as source and drain, a insulating interlayer formed over the semiconductor substrate including the first and second element isolation structures and in the element formation region, the insulating interlayer having a first opening and a second opening, in the first opening, in which at least part of the first opening exists on the first electric charge accumulation layer, a first control gate electrode formed to oppose the first electric charge accumulation layer, and in the second opening, in which at least part of the second opening exists on the second electric charge accumulation layer, a second control gate electrode formed to oppose the second electric charge accumulation layer.

DETAILED DESCRIPTION OF THE PREFERRED EMBODIMENTS

Some specific embodiments of the present invention will be described below in detail with reference to the accompanying drawings.

First Embodiment

The first embodiment will be described first. In the first embodiment, an EEPROM in which a plurality of floating gate electrode films 5 are formed on a silicon semiconductor substrate 1 and are arrayed in a matrix, as shown in FIG. 1 and FIGS. 2A to 2C, will be exemplified as a semiconductor device. In this EEPROM, a logic circuit having, e.g., a CMOS circuit is formed in the peripheral circuit region of a memory cell region.

Figure 1:
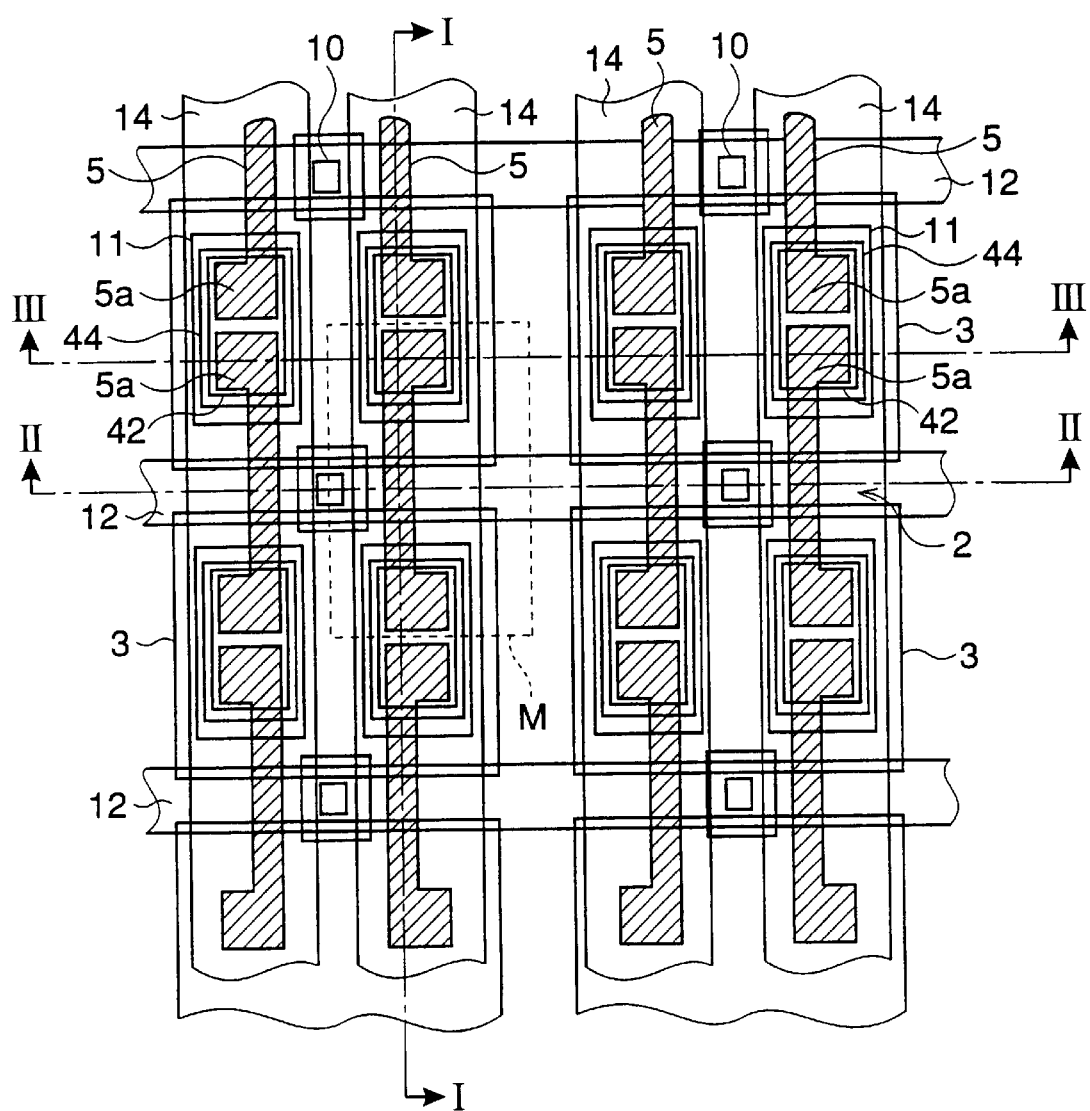
FIG. 1 is a schematic plan view showing the memory cell region of an EEPROM which is a semiconductor device according to the first embodiment of the present invention.
Figure 2A:
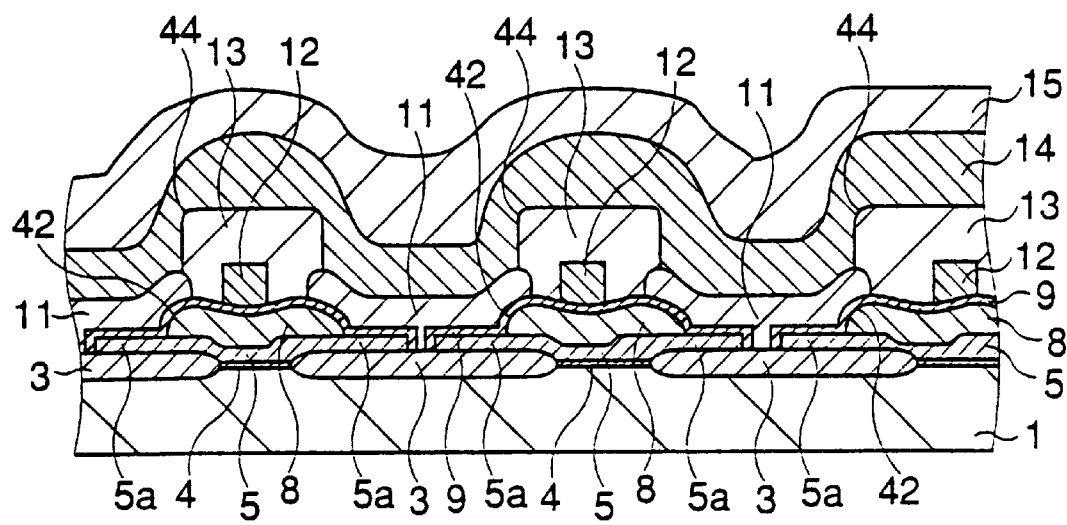
FIGS. 2A to 2C are schematic sectional views showing the memory cell region of the EEPROM according to the first embodiment of the present invention.
Figure 2B:
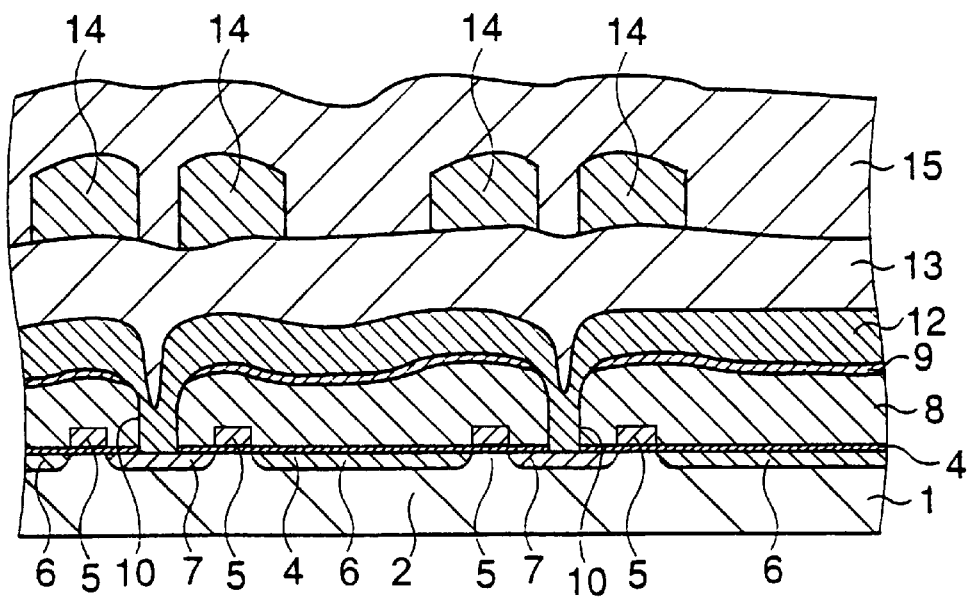
Figure 2C:
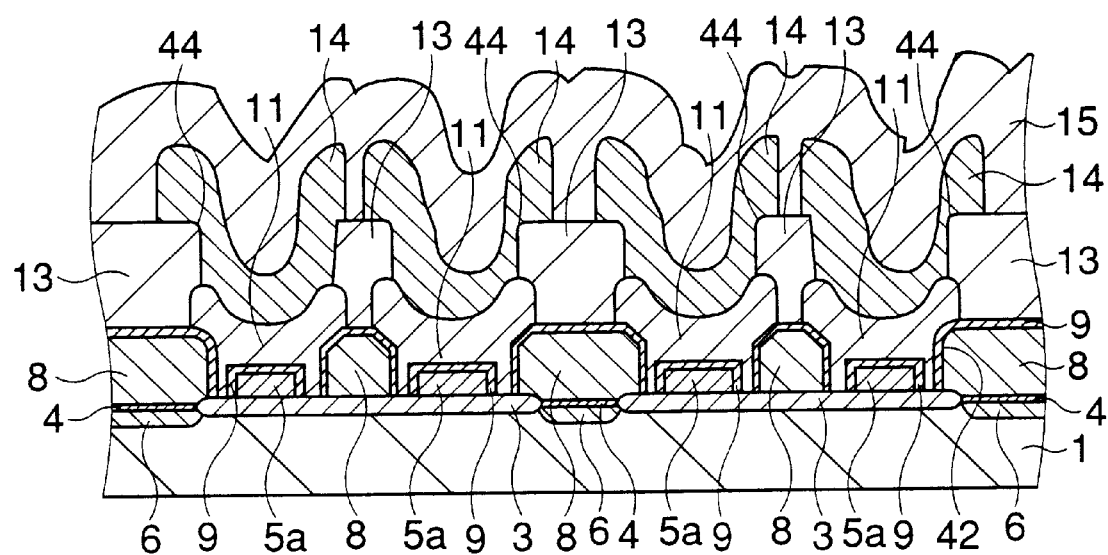

FIG. 1 is a schematic plan view showing the memory cell region of the EEPROM. FIG. 2A corresponds to a section taken along an alternate long and short dashed line A–A' in FIG. 1. FIG. 2B corresponds to a section taken along an alternate long and short dashed line B–B' in FIG. 1. FIG. 2C corresponds to a section taken along an alternate long and short dashed line C–C' in FIG. 1.

In the memory cell region of the EEPROM according to the first embodiment, a field oxide film 3 is formed on the surface region of the p-type silicon semiconductor substrate 1 to demarcate an element formation region 2. In the element formation region 2, a gate oxide film 4 is formed on the silicon semiconductor substrate 1. The floating gate electrode film 5 is formed on the gate oxide film 4 and the surface portions of the end portions of adjoining field oxide films 3. A pair of impurity diffusion layers, i.e., a source diffusion layer 6 and a drain diffusion layer 7 are formed in the surface region of the silicon semiconductor substrate 1 in the element formation region 2. An insulating interlayer 8 is deposited on a portion of surface region of the floating gate electrode film 5. A contact hole 10 is formed in the insulating interlayer 8 to obtain contact with the drain diffusion layer 7. An ONO film 9 is formed on the surface of the floating gate electrode film 5 as well as on the surface of the insulating interlayer 8. A counterelectrode film 11 is formed on the ONO film 9 at a position opposing the floating gate electrode film 5. A first wiring layer 12 serving as a bit line is formed on the ONO film 9 on the insulating interlayer 8 to fill the contact hole 10. An insulating interlayer 13 is deposited on the first wiring layer 12. A second wiring layer 14 serving as a word line is formed to be substantially perpendicular to the first wiring layer 12 with the insulating interlayer 13 intervened therebetween and electrically connected to the counterelectrode film 11. A surface protective film 15 is deposited on the entire surface including the second wiring layer 14, thus forming the memory cell region.

The field oxide film 3 is an element isolation structure formed by selectively performing high-temperature oxidation to the silicon semiconductor substrate 1. The field oxide film 3 is formed into an island shape in the surface region of the silicon semiconductor substrate 1, thereby demarcating the element formation region 2 on the silicon semiconductor substrate 1. In place of the field oxide film 3, an element isolation structure in which a shield plate electrode consisting of a polysilicon film is formed on a silicon oxide film, and another silicon oxide film is formed to cover the shield plate electrode, i.e., a field shield element isolation structure may be formed as an element isolation structure, in which the potential of the shield plate electrode is fixed to electrically disconnect the element formation regions from each other.

The floating gate electrode film 5 is made of a polysilicon film and formed under the second wiring layer 14 such that the longitudinal direction of the floating gate electrode film 5 is substantially parallel to the second wiring layer 14. The floating gate electrode film 5 extends from one field oxide film 3 to an adjacent field oxide film 3 across the gate oxide film 4 such that end portions 5a of the floating gate electrode film 5 exist on the field oxide films 3. The floating gate electrode films 5 are electrically disconnected from each other on the field oxide film 3, so that a unit memory cell M having one floating gate electrode film 5 is formed, as indicated by a broken line in FIG. 1.

As shown in FIG. 2B, the pair of impurity diffusion layers, i.e., the source diffusion layer 6 and the drain diffusion layer 7 are formed in the silicon semiconductor substrate 1 at both sides of the floating gate electrode film 5 in the element formation region 2 under the floating gate electrode film 5 and the gate oxide film 4.

The insulating interlayer 8 is made of, e.g., silicate glass containing boron (B) and phosphorus (P). The insulating interlayer 8 is formed to cover the floating gate electrode films 5 and has the contact hole 10 for exposing a surface portion of the silicon semiconductor substrate 1 in which the drain diffusion layer 7 is formed, as shown in FIG. 2B. On the field oxide film 3 as an element isolation structure, the insulating interlayer 8 has an opening 42 for exposing the end portions 5a of two floating gate electrode films 5 which are adjacent to each other on the field oxide film 3, as shown in FIGS. 2A and 2C. That is, the insulating interlayer 8 covers the floating gate electrode films 5 in the element formation region 2, except for the surfaces of the end portions 5a of the floating gate electrode films 5 existing on the field oxide film 3.

The ONO film 9 has a three-layered structure in which a nitride film is sandwiched between oxide films. The ONO film 9 is formed between the floating gate electrode film 5 and the counterelectrode film 11 to serve as a dielectric film for capacitive coupling between the floating gate electrode film 5 and the counterelectrode film 11.

The counterelectrode film 11 is formed into an independent island shape to fill the opening 42 formed in the insulating interlayer 8 above the field oxide film 3 with the ONO film 9 intervened therebetween. As shown in FIGS. 2A and 2C, the counterelectrode film 11 covers the floating gate electrode film 5 from its upper surface to its side surface with the ONO film 9 intervened therebetween. In addition, as shown in FIG. 2A, the counterelectrode film 11 is formed under the second wiring layer 14 to oppose the end portions 5a of the left and right floating gate electrode films 5 existing on the field oxide film 3 with the ONO film 9 intervened therebetween. The counterelectrode films 11 are electrically disconnected from each other by the insulating interlayer 8 above the field oxide film 3. One counterelectrode film 11 and two gate electrode films 5 (the end portions 5a of the floating gate electrode films 5) which are adjacent to each other and exist under the counterelectrode film 11 with the ONO film 9 intervened therebetween are capacitively coupled to each other.

The first wiring layer 12 is formed by patterning a polysilicon film into a strip shape. As shown in FIG. 2A, the first wiring layer 12 extends substantially perpendicular to the longitudinal direction of the floating gate electrode film 5 with the insulating interlayer 8 and the ONO film 9 intervened therebetween substantially at the central portion of the floating gate electrode film 5 along the longitudinal direction. As shown in FIG. 2B, the first wiring layer 12 extends on the insulating interlayer 8 to fill the contact holes 10 arranged in the row direction in FIG. 1. The first wiring layer 12 is simultaneously formed together with the counterelectrode film 11 by patterning the polysilicon film formed on the insulating interlayer 8 and the ONO film 9. Therefore, the first wiring layer 12 is formed substantially at the same level as that of the counterelectrode film 11.

The insulating interlayer 13 is made of a silicon oxide film and is patterned to cover the first wiring layer 12. The insulating interlayer 13 electrically disconnects the counterelectrode film 11 from the first wiring layer 12.

The second wiring layer 14 is made of a metal layer of, e.g., an aluminum alloy. As shown in FIGS. 2A and 2B, the second wiring layer 14 is formed above the floating gate electrode film 5 to be substantially parallel to the longitudinal direction of the floating gate electrode film 5, i.e., substantially perpendicular to the first wiring layer 12. The second wiring layer 14 extends on the insulating interlayer 13 covering the first wiring layer 12 and the counterelectrode film 11, as shown in FIGS. 2A and 2C. The second wiring layer 14 is electrically disconnected from the first wiring layer 12 by the insulating interlayer 13 and is electrically connected to the counterelectrode films 11 arranged in the column direction in FIG. 1 and serves as a control gate for the floating gate electrode film 5.

In this EEPROM, on the field oxide film 3 as an element isolation structure, the counterelectrode film 11, i.e., the second wiring layer 14 serving as a word line and two floating gate electrode films 5 (the end portions 5a of the floating gate electrode films 5) which are adjacent to each other on the field oxide film 3 are capacitively coupled, as described above. Therefore, in the operation of the EEPROM, a predetermined voltage is applied to a desired first wiring layer 12 serving as a bit line to apply the voltage to the drain diffusion layers 7 electrically connected to the first wiring layer 12 through the contact holes 10 arranged in the row direction. At the same time, a predetermined voltage is applied to a desired second wiring layer 14 serving as a word line to apply predetermined charges to the opposing floating gate electrode films 5 (the end portions 5a of the floating gate electrode films 5) from the counterelectrode films 11 arranged in the column direction and electrically connected to the second wiring layer 14. With this operation, a desired unit memory cell M is uniquely selected.

As described above, according to the EEPROM of the first embodiment, the first wiring layers 12 serving as bit lines and the second wiring layers 14 serving as word lines are stacked to cross each other with the insulating interlayer 13 intervened therebetween, and the first wiring layers 12 are formed under the second wiring layers 14. Therefore, the contact hole 10 formed to obtain bit contact can be made shallow, i.e., formed to a depth with substantially the same value as that of the thickness of the single insulating interlayer 8 formed on the surface of the silicon semiconductor substrate 1 while ensuring a normal EEPROM operation. With this structure, the aspect ratio of the contact hole 10 can be made low to further decrease the hole diameter.

In addition, according to the EEPROM, the second wiring layer 14 serving as a word line is made of a metal layer, as described above. The word line has a much smaller electrical resistance value than one made of a polysilicon film in silicon process. Since the electrical resistance value need not be decreased by forming a back wiring layer or the like, the number of processes decreases.

Furthermore, according to the EEPROM, the counterelectrode film 11 covers, with the ONO film 9 intervened, two floating gate electrode films 5 adjacent to each other on the field oxide film 3, and is arranged to oppose the end portions 5a of these floating gate electrode films 5, as described above. More specifically, the counterelectrode film 11 is capacitively coupled not only to the upper surfaces of the floating gate electrode films 5 but also to part of the side surfaces of the floating gate electrode films 5, as shown in FIG. 2C. The counterelectrode film 11 is also capacitively coupled to the end portions 5a of the two floating gate electrode films 5, as shown in FIG. 2A. With this structure, a high capacitive coupling ratio can be obtained.

Second Embodiment

The second embodiment of the present invention will be described below. In the second embodiment, a method of manufacturing a semiconductor device (to be simply referred to as a "logic LSI" hereinafter) which has, on a p-type silicon semiconductor substrate 1, EEPROM memory cell regions (to be simply referred to as "memory cell regions" hereinafter) having floating gate electrode films 5 and arrayed in a matrix, and memory cell peripheral circuit regions (to be simply referred to as "peripheral circuit regions" hereinafter) including logic circuits having CMOS circuits each having a p-type transistor and an n-type transistor will be exemplified. The same reference numerals as in FIG. 1 and FIGS. 2A to 2C of the first embodiment denote the same parts in the second embodiment, and a detailed description thereof will be omitted.

Figure 3A:
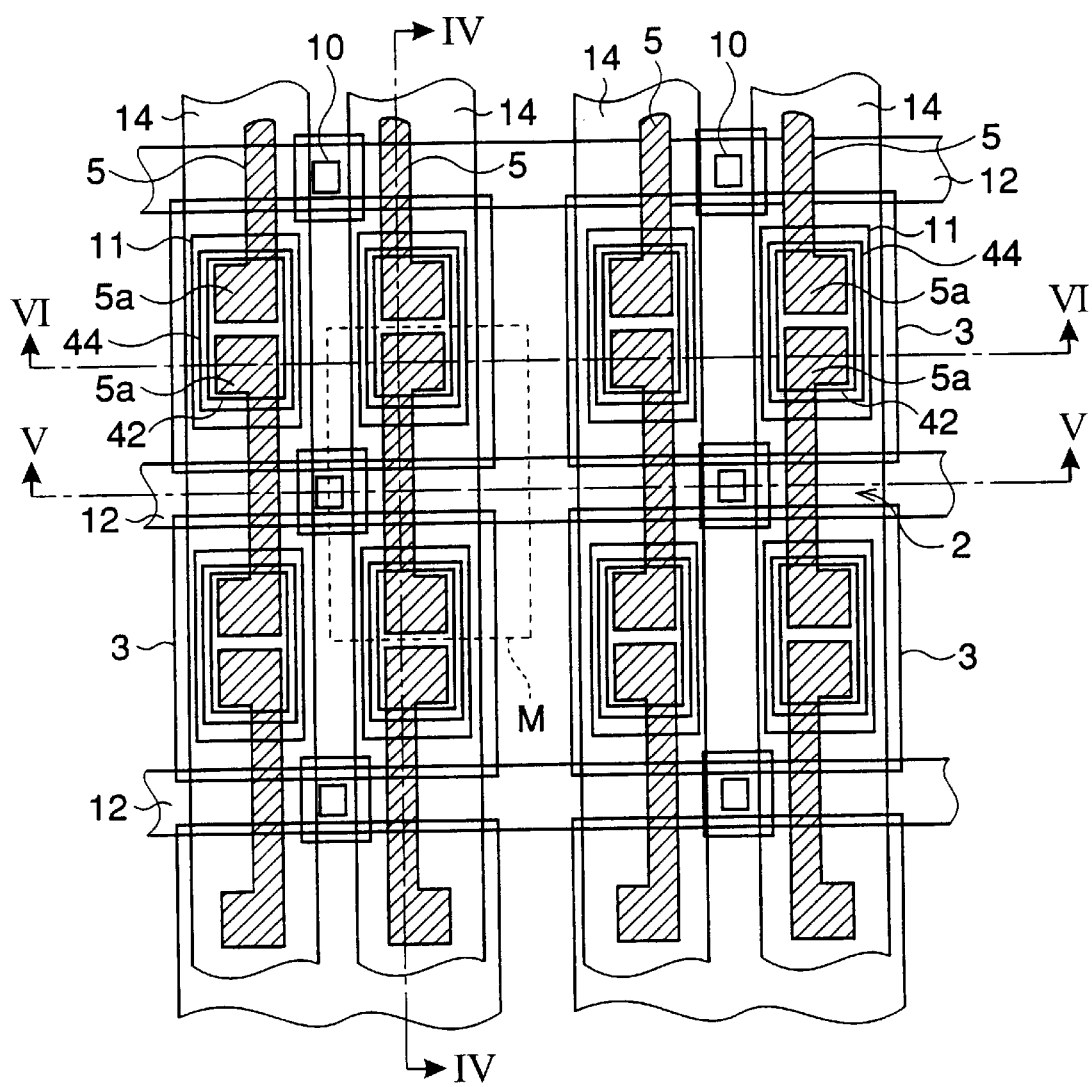
FIGS. 3A and 3B are schematic plan views showing the memory cell region and its peripheral circuit region of a logic LSI manufactured in the second embodiment of the present invention.
Figure 3B:
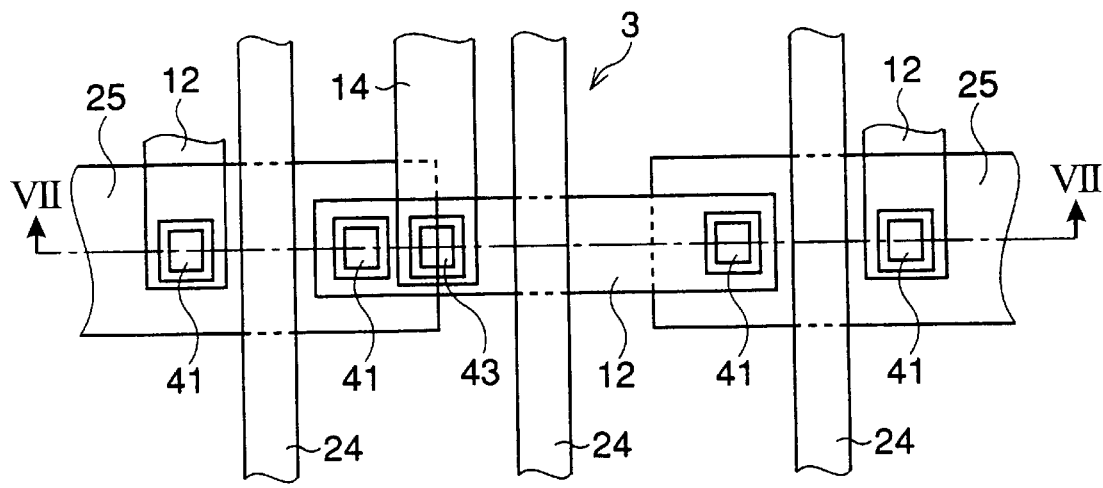
Figure 4A:
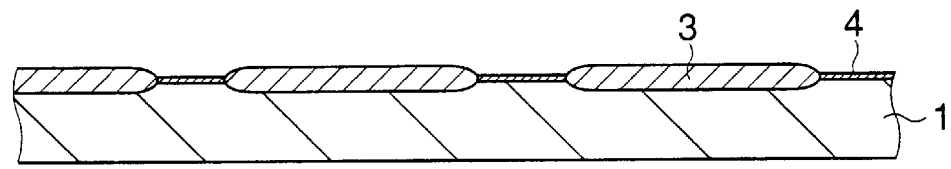
FIGS. 4A to 4D are schematic sectional views showing steps in manufacturing the logic LSI according to the second embodiment of the present invention.
Figure 4B:
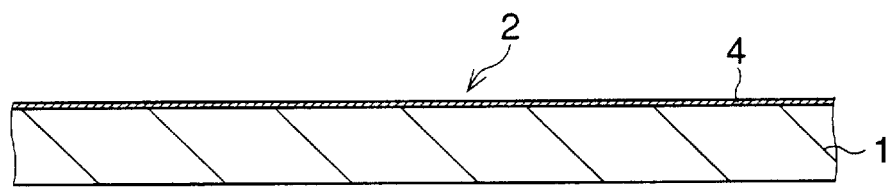
Figure 4C:
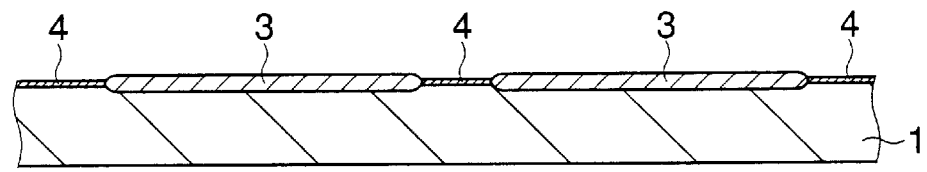
Figure 4D:
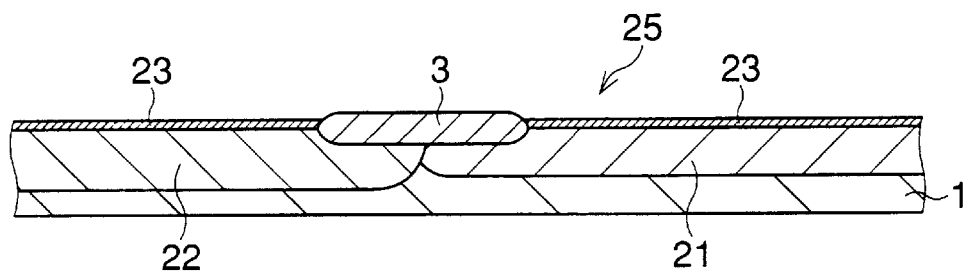

FIGS. 3A and 3B are schematic plan views showing the memory cell region and peripheral circuit region of the logic LSI. FIG. 3A corresponds to the memory cell region, and FIG. 3B corresponds to the peripheral circuit region. FIGS. 4A, 5A, 6A, 7A, 8A, 9A, and 10A correspond to a section taken along an alternate long and short dashed line A–A' in FIG. 3A. FIGS. 4B, 5B, 6B, 7B, 8B, 9B, and 10B correspond to a section taken along an alternate long and short dashed line B–B' in FIG. 3A. FIGS. 4C, 5C, 6C, 7C, 8C, 9C, and 10C correspond to a section taken along an alternate long and short dashed line C–C' in FIG. 3A. FIGS. 4D, 5D, 6D, 7D, 8D, 9D, and 10D correspond to a section taken along an alternate long and short dashed line D–D' in FIG. 3B.

As shown in FIGS. 4A to 4D, p- and n-type well diffusion layers 21 and 22 are formed in the silicon semiconductor substrate 1 of the peripheral circuit region by ion implantation. Subsequently, a field oxide film 3 having a thickness of about 2,000 to 6,000 Å is formed by, e.g., LOCOS as an element isolation structure at a position where the memory cell region and peripheral circuit region are to be formed, thereby demarcating an element formation region 2 in the memory cell region, and an element formation region 25 in the peripheral circuit region.

Instead of forming the field oxide film 3, a field shield element isolation process may be used to sequentially form a silicon oxide film, a polysilicon film, and a silicon oxide film on the silicon semiconductor substrate 1 and perform photolithography and etching, thereby forming a field shield element isolation structure in which a shield gate electrode is buried in the silicon oxide film.

The entire surface of the silicon semiconductor substrate 1 is thermally oxidized to form a gate oxide film having a thickness of 80 to 250 Å. Thereafter, wet etching is performed while covering the surface of the silicon semiconductor substrate 1 in the peripheral circuit region by a mask, thereby removing the gate oxide film in the element formation region 2 of the memory cell region. The entire surface is subjected to thermal oxidation again to form a gate oxide film 4 having a thickness of 50 to 120 Å in the element formation region 2 of the memory cell region and a gate oxide film 23 having a thickness of 120 to 300 Å in the element formation region 25 of the peripheral circuit region. In the memory cell region, a tunnel oxide film having a thickness of 70 to 120 Å may be formed in place of the gate oxide film 4.

When a UV erase type EPROM is to be manufactured instead of the EEPROM, the process of removing the gate oxide film in the memory cell region is omitted.

As shown in FIGS. 5A to 5D, a polysilicon film is formed on the entire surface by vacuum thin film formation such as CVD and patterned by photolithography and dry etching. With this process, in the memory cell region, the floating gate electrode film 5 having a predetermined shape is formed to extend from a field oxide film 3 to an adjacent field oxide film 3 across the gate oxide film 4 so that end portions 5a exist on the field oxide films 3. In the peripheral circuit region, a gate electrode film 24 of a transistor is formed on the gate oxide film 23. In place of the polysilicon film, a film substantially made of at least one material selected from the group consisting of ruthenium dioxide, vanadium oxide, and indium oxide may be formed.

Next, arsenic (As) is ion-implanted into the silicon semiconductor substrate 1 in the memory cell region and the region of the p-type well diffusion layer 21 in the peripheral circuit region to form a source diffusion layer 6 and a drain diffusion layer 7 of a memory cell transistor and a source diffusion layer 31 and a drain diffusion layer 32 of an nMOS transistor in the peripheral circuit region. Thereafter, boron (B) is ion-implanted into the silicon semiconductor substrate 1 in the region of the n-type well diffusion layer 22 in the peripheral circuit region to form a source diffusion layer 34 and a drain diffusion layer 33 of a pMOS transistor in the peripheral circuit region.

Figure 5A:
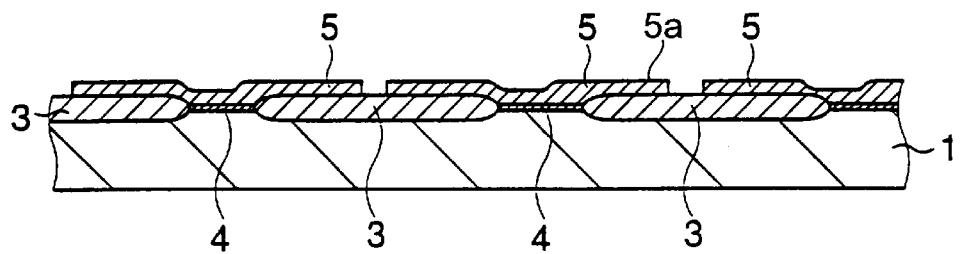
FIGS. 5A to 5D are schematic sectional views showing steps in manufacturing the logic LSI according to the second embodiment of the present invention.
Figure 5B:
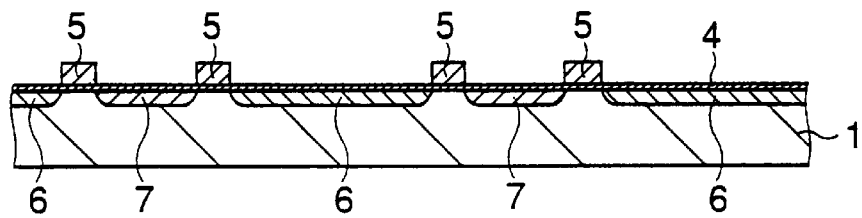
Figure 5C:
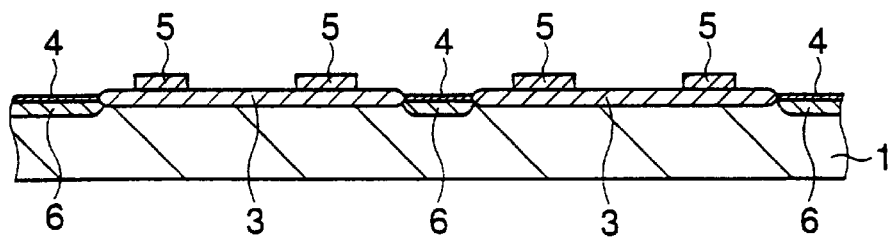
Figure 5D:
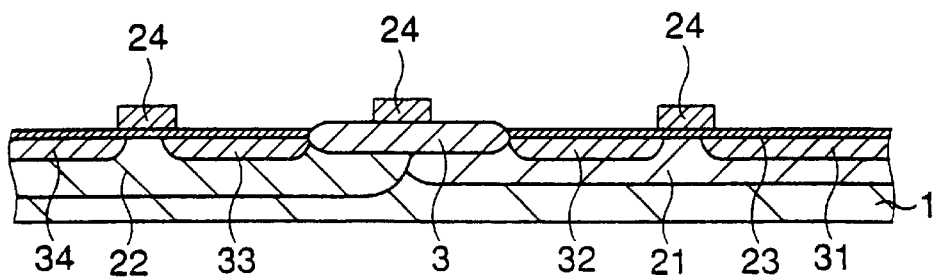

The source diffusion layer 6 and the drain diffusion layer 7 of the memory cell transistor in the memory cell region are formed so that the end portions of these layers overlap, with the gate oxide film 4 intervened, the end portions of the floating gate electrode films 5 formed above, as shown in FIG. 5B. The source diffusion layers 31 and 34 and the drain diffusion layers 32 and 33 of the nMOS and pMOS transistors in the peripheral circuit region are formed so that the end portions of these layers overlap, with the gate oxide film 23 intervened, the end portions of the gate electrode films 24 formed above, as shown in FIG. 5D.

As shown in FIGS. 6A to 6D, an insulating film made of, e.g., silicate glass containing boron (B) and phosphorus (P) is deposited on the entire surface by, e.g., atmospheric pressure CVD and patterned into a predetermined shape by photolithography and dry etching, thereby forming an insulating interlayer 8.

Figure 6A:
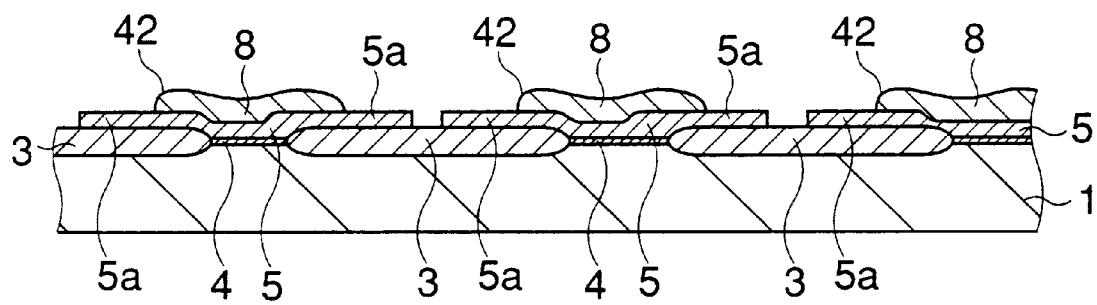
FIGS. 6A to 6D are schematic sectional views showing steps in manufacturing the logic LSI according to the second embodiment of the present invention.
Figure 6B:
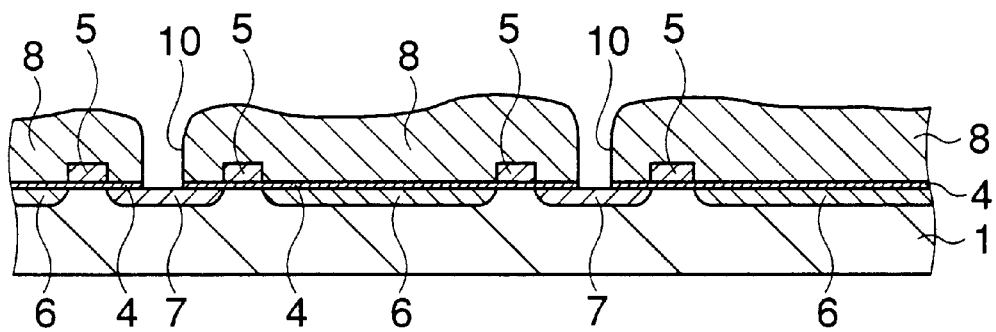
Figure 6C:
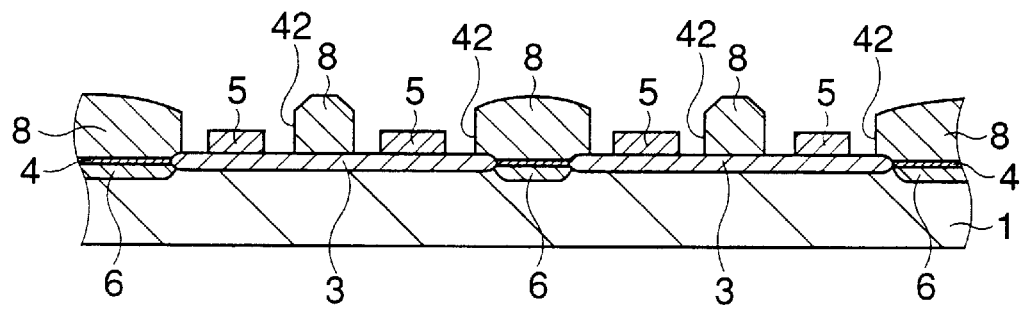

More specifically, in the element formation region 2 of the memory cell region, the insulating interlayer 8 is patterned to cover the floating gate electrode films 5, as shown in FIGS. 6A and 6B. Above the field oxide film 3 as an element isolation structure, the insulating interlayer 8 is patterned to be left between the end portions 5a of the floating gate electrode films 5 existing on the field oxide film 3, as shown in FIG. 6A and 6C. In the peripheral circuit region, the insulating interlayer 8 is formed on the entire surface to cover the gate electrode film 24.

In the memory cell region, subsequently, a contact hole 10 and an opening 42 are formed in the insulating interlayer 8. In the peripheral circuit region, contact holes 41 are formed in the insulating interlayer 8.

More specifically, in the memory cell region, the opening 42 is formed in the insulating interlayer 8 above the field oxide film 3 to expose the end portions 5a of two floating gate electrode films 5 which are adjacent to each other on the field oxide film 3, as shown in FIGS. 6A and 6C. In addition, the contact hole 10 is formed in the insulating interlayer 8 to expose a surface portion of the silicon semiconductor substrate 1 in which the drain diffusion layer 7 is formed, as shown in FIG. 6B.

Figure 6D:
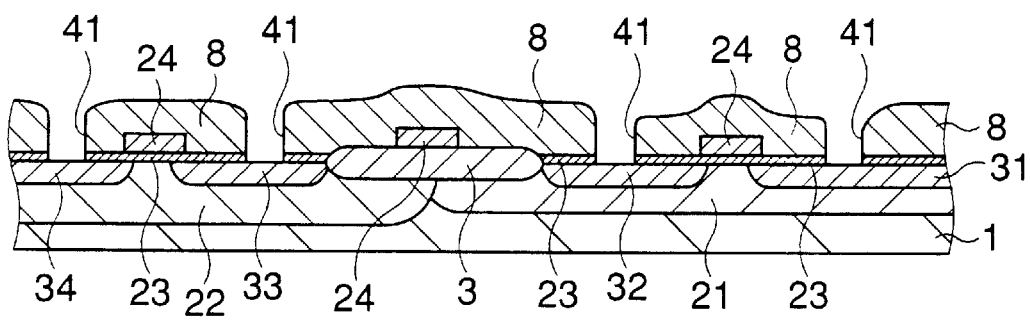

In the peripheral circuit region, the contact holes 41 are formed in the insulating interlayer 8 to expose surface portions of the silicon semiconductor substrate 1 in which the source diffusion layers 31 and 34 and the drain diffusion layers 32 and 33 of the nMOS and pMOS transistors are formed, as shown in FIG. 6D.

Next, as shown in FIGS. 7A to 7D, a silicon oxide film, a silicon nitride film, and a silicon oxide film are sequentially formed on the entire surface by, e.g., low pressure CVD to form an ONO film 9 so that the thickness becomes 150 to 300 Å in conversion to the oxide film capacitance. In place of the ONO film 9, an NO film in which a nitride film and an oxide film are sequentially formed, or a high dielectric thin film made of at least one material selected from the group consisting of lead titanate, lead titanate/zirconium, lead titanate/zirconium/lanthanum, strontium titanate, strontium titanate/barium, tantalum oxide, bismuth oxide, yttrium oxide, zirconium oxide, and tungsten bronze may be formed.

Figure 7A:
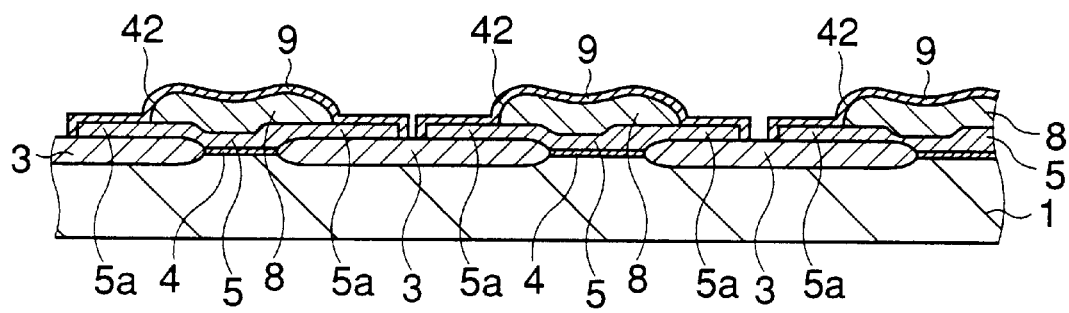
FIGS. 7A to 7D are schematic sectional views showing steps in manufacturing the logic LSI according to the second embodiment of the present invention.
Figure 7B:
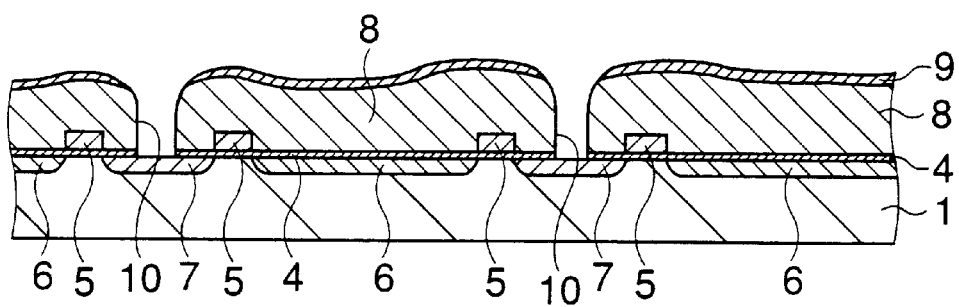
Figure 7C:
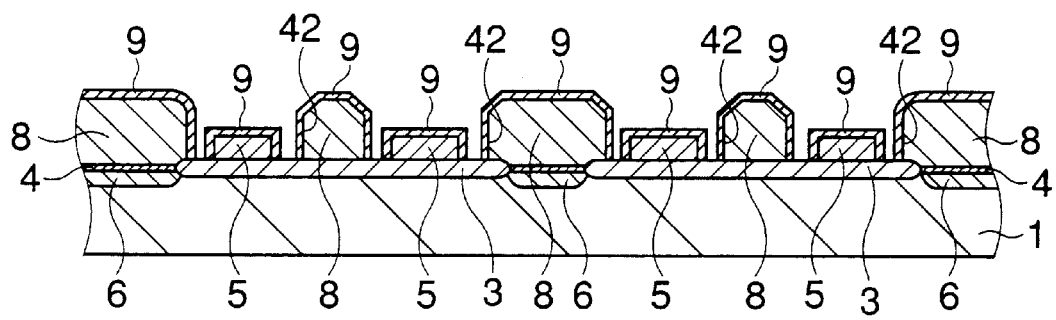
Figure 7D:
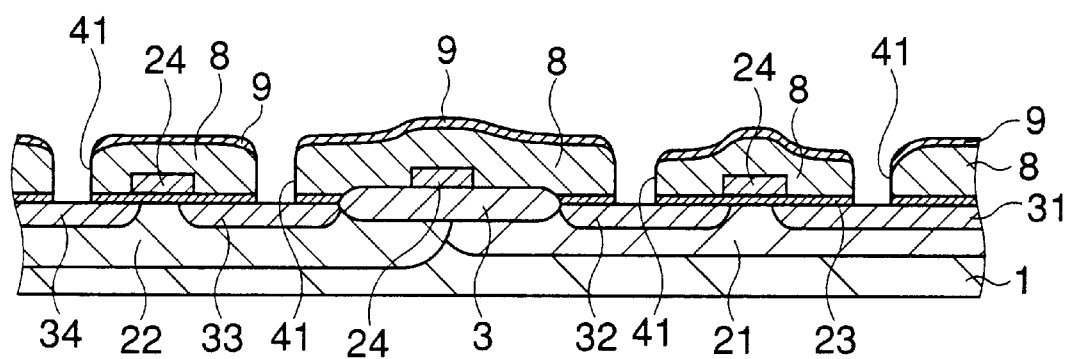

Subsequently, photolithography and dry etching are performed to remove the ONO film 9 deposited in the contact hole 10 in the memory cell region, as shown in FIG. 7B, and the ONO film 9 deposited in the contact holes 41 in the peripheral circuit region, as shown in FIG. 7D.

Next, as shown in FIGS. 8A to 8D, a polysilicon film is deposited on the entire surface including the contact hole 10 and the opening 42 (on the upper surface of the ONO film 9 formed in the opening 42) in the memory cell region and the contact holes 41 in the peripheral circuit region by vacuum deposition such as CVD.

The polysilicon film is subjected to photolithography and dry etching to simultaneously form a counterelectrode film 11, a first wiring layer 12 in the memory cell region, and the first wiring layer 12 in the peripheral circuit region.

Figure 8A:
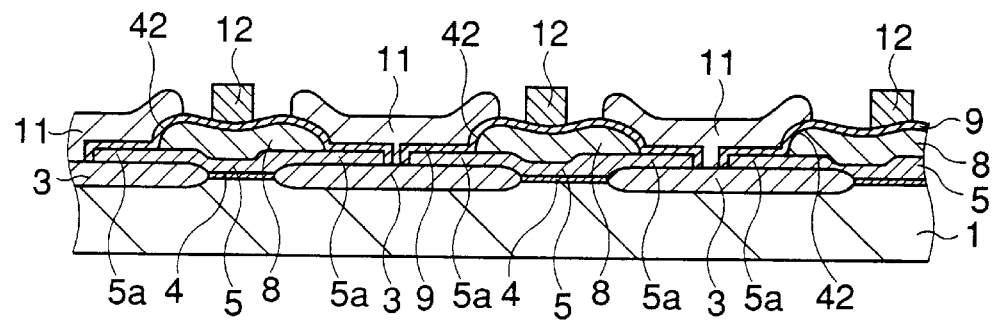
FIGS. 8A to 8D are schematic sectional views showing steps in manufacturing the logic LSI according to the second embodiment of the present invention.
Figure 8B:
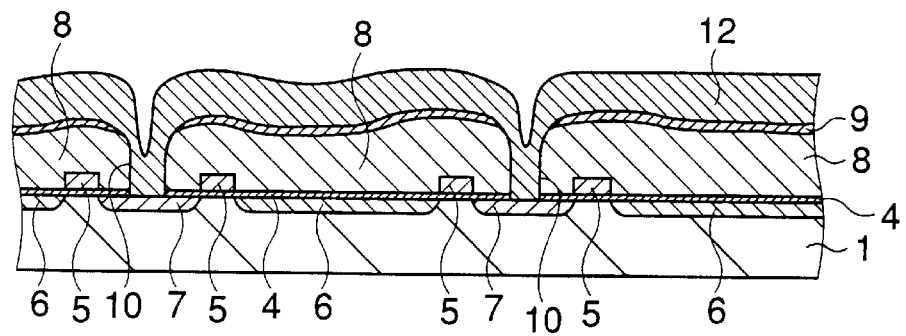
Figure 8C:
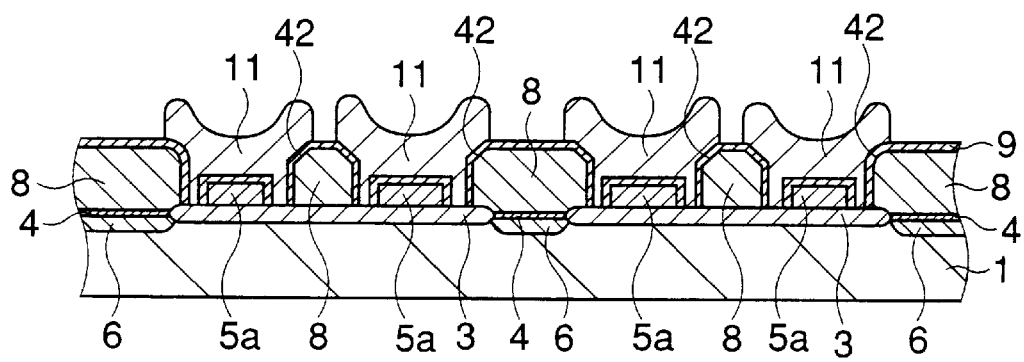

More specifically, in the memory cell region, part of the polysilicon film on the ONO film 9 formed on the insulating interlayer 8 is removed to form the counterelectrode films 11 and the first wiring layer 12 serving as a bit line which are electrically disconnected from each other on the ONO film 9, as shown in FIGS. 8A to 8C.

As shown in FIG. 8C, the counterelectrode film 11 is formed into a shape for covering, with the ONO film 9 intervened, the floating gate electrode film 5 from its upper surface to part of its two side surfaces on the field oxide film 3. In addition, as shown in FIG. 8A, the counterelectrode film 11 is formed to oppose, with the ONO film 9 intervened, the end portions 5a of the left and right floating gate electrode films 5 existing on the field oxide film 3 in the opening 42.

As shown in FIG. 8A, the first wiring layer 12 extends substantially perpendicular to the longitudinal direction of the floating gate electrode film 5 with the insulating interlayer 8 and the ONO film 9 intervened therebetween substantially at the central portion of the floating gate electrode film 5 along the longitudinal direction. As shown in FIG. 8B, the first wiring layer 12 extends on the insulating interlayer 8 to fill the contact hole 10 formed in the insulating interlayer 8. The first wiring layer 12 in the memory cell region is electrically connected to the surface portion of the silicon semiconductor substrate 1 where the drain diffusion layer 7 is formed through the contact hole 10 and serves as a bit line.

Figure 8D:
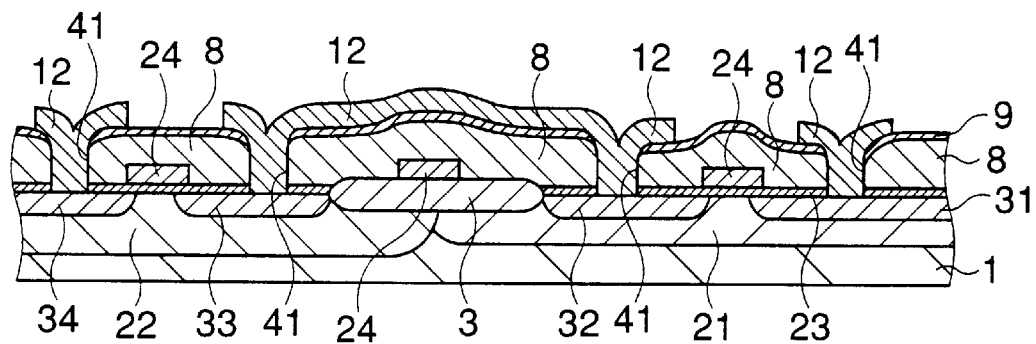

In the peripheral circuit region, as shown in FIG. 8D, part of the polysilicon film deposited on the insulating interlayer 8 is removed to form the first wiring layer 12 into a predetermined shape such that the first wiring layers 12 fill in the contact holes 41 formed in the insulating interlayer 8 and are electrically disconnected from each other on the insulating interlayer 8. At this time, the drain diffusion layer 32 of the nMOS transistor and the drain diffusion layer 33 of the pMOS transistor are electrically connected through the contact holes 41 and the first wiring layer 12.

Next, as shown in FIGS. 9A to 9D, a silicon oxide film is deposited on the entire surface by, e.g., plasma CVD to form an insulating interlayer 13. The insulating interlayer 13 is planarized by chemical-mechanical polishing (CMP) and patterned by photolithography and dry etching.

Figure 9A:
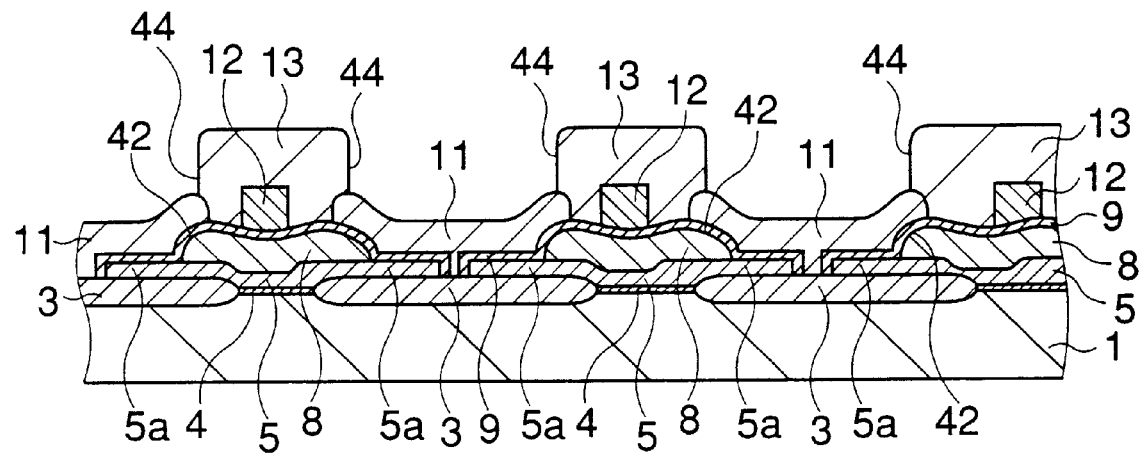
FIGS. 9A to 9D are schematic sectional views showing steps in manufacturing the logic LSI according to the second embodiment of the present invention.
Figure 9B:
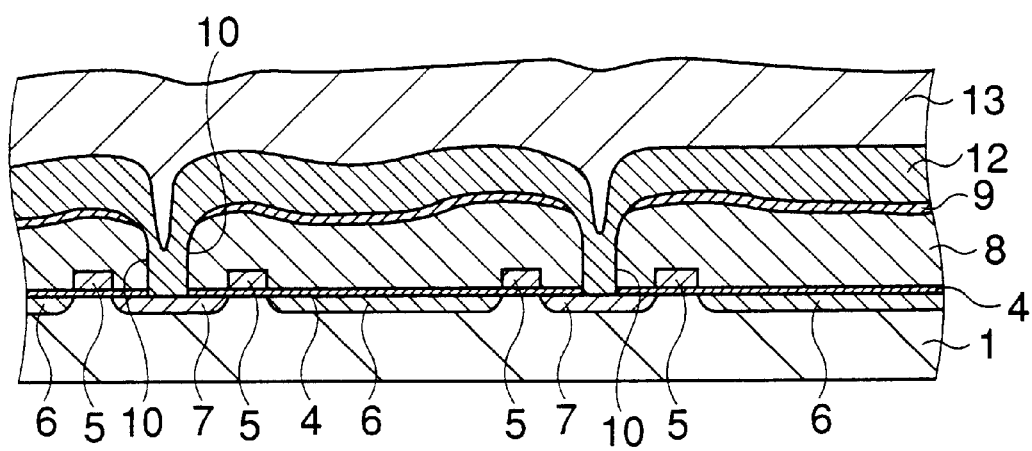
Figure 9C:
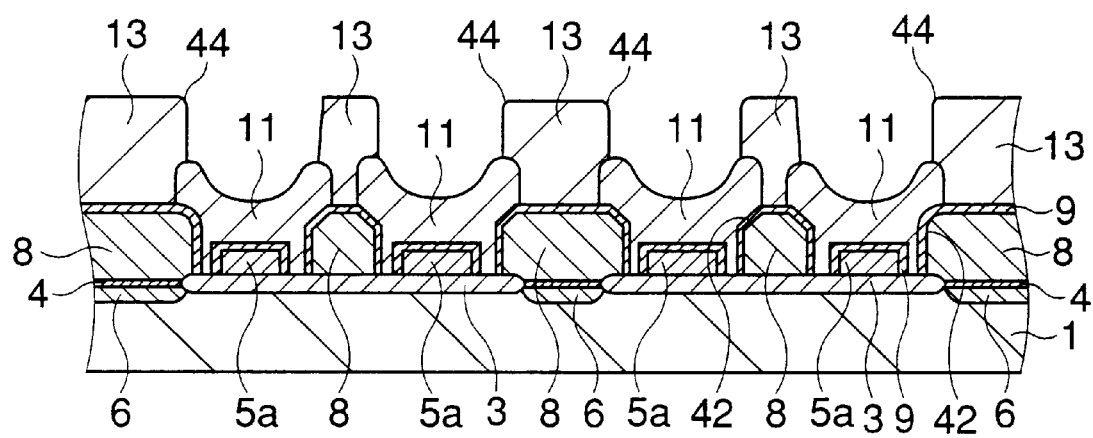
Figure 9D:
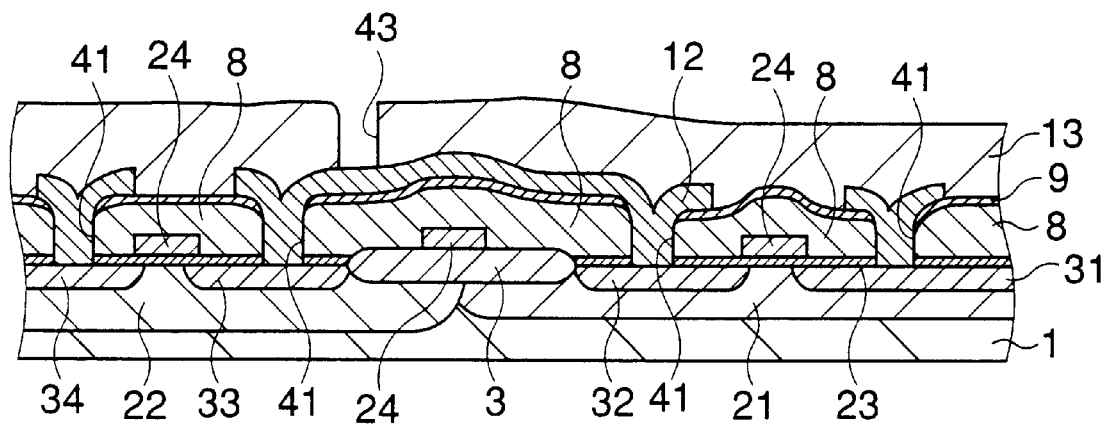

More specifically, in the memory cell region, an opening 44 is formed in the surface-planarized insulating interlayer 13 to expose the surface portion of the counterelectrode film 11, as shown in FIG. 9A. In the peripheral circuit region, a contact hole 43 is formed in the surface-planarized insulating tnlerlayer 13 to expose the surface portion of the first wiring layer 12 which is electrically connected to the drain diffusion layers 32 and 33 of the nMOS and pMOS transistors, as shown in FIG. 9D.

The insulating interlayer 13 may be formed in the following manner. A silicon oxide film is deposited on the entire surface by, e.g., plasma CVD, and an SOG (Spin On Glass) is applied. The entire surface is etched back, and a silicon oxide film is deposited on the entire surface by plasma CVD again, thereby forming the insulating interlayer 13.

Subsequently, as shown in FIGS. 10A to 10D, a metal film of, e.g., an aluminum alloy is formed on the entire surface of the silicon semiconductor substrate 1 in the memory cell region and the peripheral circuit region by sputtering or the like. This metal film is patterned by photolithography and dry etching to form the second wiring layer 14 in the memory cell region and the peripheral circuit region.

Figure 10A:
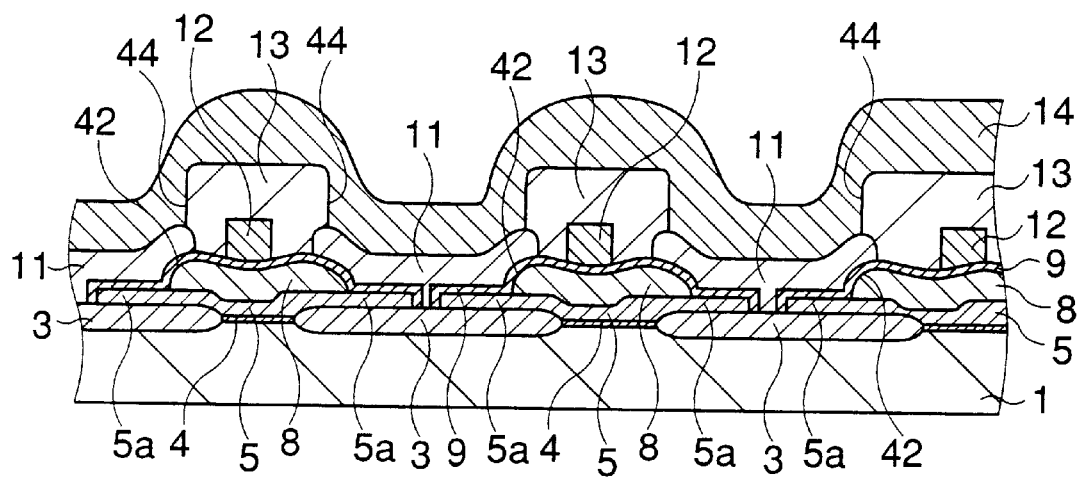
FIGS. 10A to 10D are schematic sectional views showing steps in manufacturing the logic LSI according to the second embodiment of the present invention.
Figure 10B:
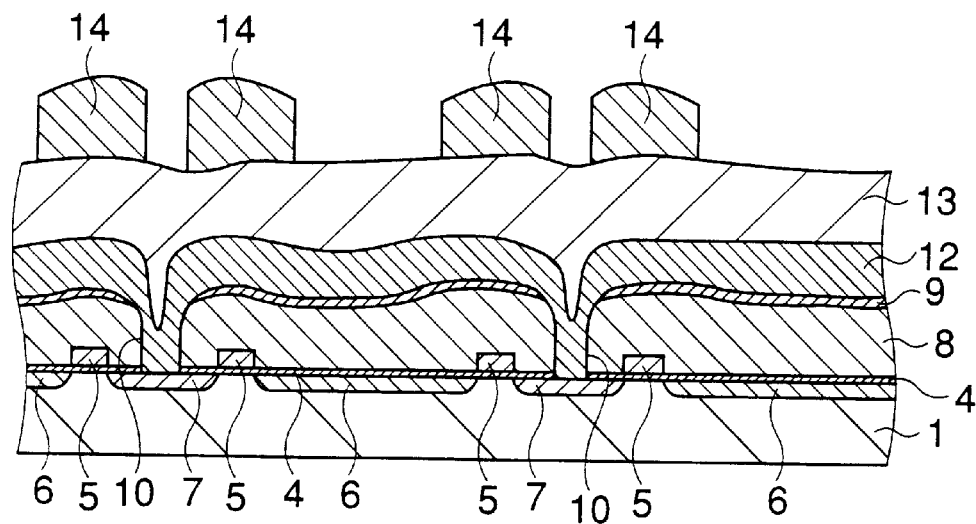
Figure 10C:
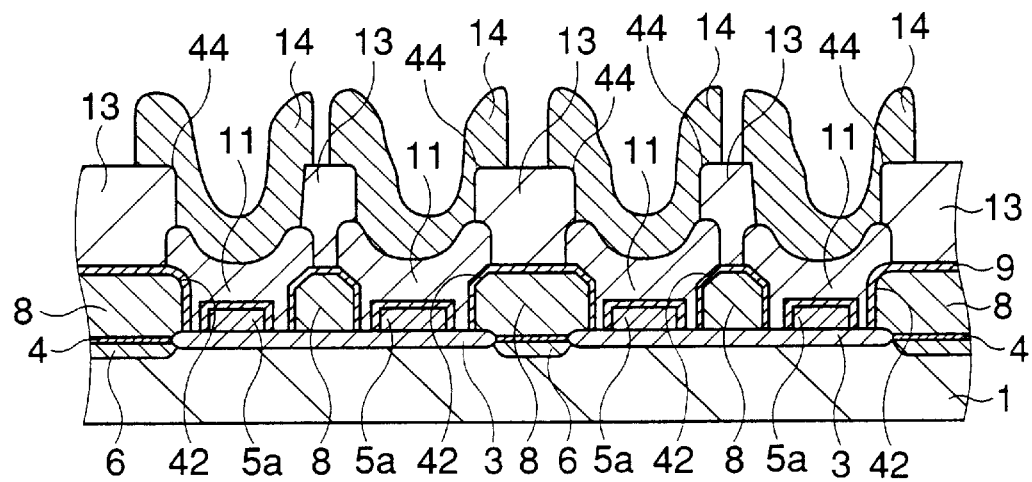

More specifically, in the memory cell region, as shown in FIGS. 10A and 10B, in order to form the second wiring layer 14 serving as a word line, the metal film is formed into a shape so that the second wiring layer 14 extends on the insulating interlayer 13 covering the first wiring layer 12 and the counterelectrode film 11 exposed to the bottom portion in the opening 44 and is formed above the floating gate electrode film 5 to be substantially parallel to the longitudinal direction of the floating gate electrode film 5, i.e., substantially perpendicular to the first wiring layer 12. At this time, the second wiring layer 14 is electrically disconnected from the first wiring layer 12 by the insulating interlayer 13 and electrically connected to the counterelectrode film 11 so that the second wiring layer 14 serves as a control gate for the floating gate electrode film 5.

Figure 10D:
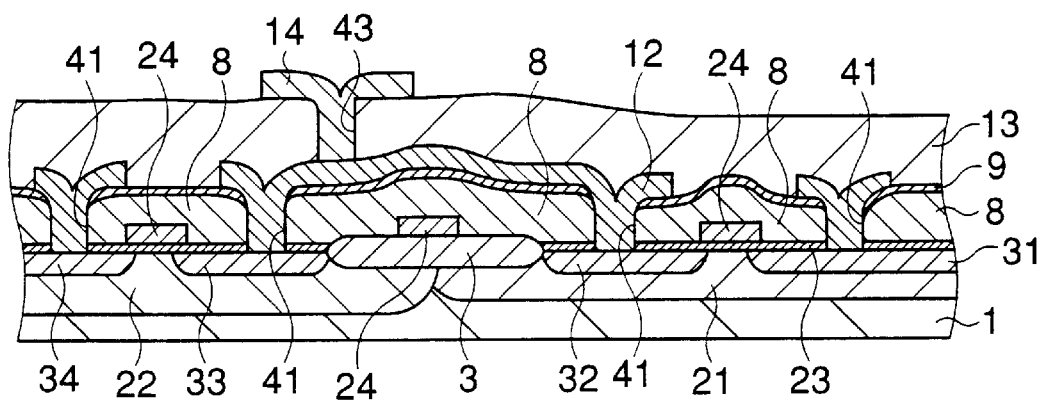

In the peripheral circuit region, as shown in FIG. 10D, the metal film deposited on the insulating interlayer 13 to fill the contact hole 43 is patterned to form the second wiring layer 14 which is electrically connected to the first wiring layer 12 through the contact hole 43.

The second wiring layer 14 may be formed in the following manner. A polysilicon film doped with, e.g., phosphorus (P) or a metal thin film made of, e.g., tungsten is deposited on the entire surface. The polysilicon film on the insulating interlayer 13 is removed by a planarization process such as etch back or CMP to form contact plugs in the opening 44 formed in the insulating interlayer 13 in the memory cell region and in the contact hole 43 formed in the insulating interlayer 13 in the peripheral circuit region. Thereafter, a metal film of, e.g., an aluminum alloy is formed on the entire surface and patterned, thereby forming the second wiring layer 14 electrically connected to the contact plugs.

Thereafter, as shown in FIG. 2A, a surface protective film 15 consisting of a silicon oxide film or the like is formed on the entire surface of the silicon semiconductor substrate 1 in the memory cell region and the peripheral circuit region by, e.g., CVD, thereby completing the logic LSI of the second embodiment.

The output terminal of a decoder belonging to the peripheral circuit region is connected to the drain diffusion layers 32 and 33 of the pMOS and nMOS transistors in the peripheral circuit region. The output terminal is also connected to the drain diffusion layer 7 of the memory cell transistor in the memory cell region through the second wiring layer 14.

As described above, according to the method of manufacturing the logic LSI of the second embodiment, in formation of the polysilicon film as the counterelectrode film 11 and the first wiring layer 12 in the memory cell region, the polysilicon film is also deposited on the insulating interlayer 8 including the contact holes 41 in the peripheral circuit region. When the polysilicon film in the memory cell region is patterned into the counterelectrode film 11 and the first wiring layer 12, the polysilicon film in the peripheral circuit region is simultaneously patterned into the first wiring layer 12 which is electrically connected to the source diffusion layers 31 and 34 and the drain diffusion layers 32 and 33. Therefore, the process of forming the control gate electrode film which is not present in the peripheral circuit region while masking the peripheral circuit region is omitted, so that the photolithography process is omitted to simplify the manufacturing process.

As described above, according to this manufacturing method, on the field oxide film 3, the counterelectrode film 11 is formed to oppose, with the ONO film 9 intervened, the end portions 5a of two floating gate electrode films 5 adjacent to each other. In formation of the floating gate electrode film 5 in the opening 42, even when the opening 42 and the floating gate electrode film 5 are shifted in the left or right direction in micropatterning, the overlapping area of the opening 42 and the floating gate electrode film 5 maintains a predetermined value relative to that of an adjacent unit memory cell M, so no difference in capacitive coupling ratio is generated between the unit memory cells M. More specifically, the positioning accuracy between the opening 42 and the floating gate electrode film 5 can be relaxed, while a desired predetermined capacitive coupling ratio is achieved.

In addition, according to this manufacturing method, the second wiring layer 14 and the counterelectrode film 11 are formed to overlap the floating gate electrode film 5 on the field oxide film 3 with the ONO film 9 intervened therebetween, as described above. Therefore, simply by adding several processes to the conventional standard logic LSI process, an EEPROM memory cell can be easily formed without complicating the manufacturing process.

The counterelectrode film 11 is formed to cover the floating gate electrode film 5 from its upper surface to part of the side surface with the ONO film 9 intervened therebetween. In this structure, the opposing area between the counterelectrode film 11 and the floating gate electrode film 5 increases as compared to a structure in which the counterelectrode film 11 is simply formed above the floating gate electrode film 5. Therefore, the capacitive coupling ratio between the electrode films 5 and 11 can be increased as compared to the structure in which the counterelectrode film 11 is simply formed above the floating gate electrode film 5, although the memory size is kept unchanged. When the same voltage is applied to the drain diffusion layer 7 or the couriterelectrode film 11 (i.e., the second wiring layer 14 serving as a word line), a large electric field is applied to the gate oxide film 4.

More specifically, in, e.g., writing, the source diffusion layer 6 and the silicon semiconductor substrate 1 are set at a ground potential. A voltage of 5 V is applied to the drain diffusion layer 7, and thermions generated from the end portion of the drain diffusion layer 7 are injected into the floating gate electrode film 5. In this case, the voltage to be applied to the counterelectrode film 11 can be lowered. For example, when the word line is simply formed above the floating gate electrode film, a voltage of 12 V must be applied to the counterelectrode film 11. In this embodiment, this voltage can be lowered to 6 to 7 V.

In the case that a tunnel oxide film is formed in place of the gate oxide film 4, when the word line is simply formed above the floating gate electrode film, a voltage of 14 V must be applied to the drain diffusion layer. In this embodiment, however, a similar rewrite operation can be performed with an applied voltage of 11 V, although the memory size is kept unchanged.

Third Embodiment

The third embodiment of the present invention will be described below. In the third embodiment, an EEPROM will be exemplified, as in the first embodiment. The EEPROM according to the third embodiment is different from that of the first embodiment mainly in the shape of the counterelectrode film. The same reference numerals as in the EEPROM of the first embodiment denote the same parts in the third embodiment, and a detailed description thereof will be omitted.

Figure 11A:
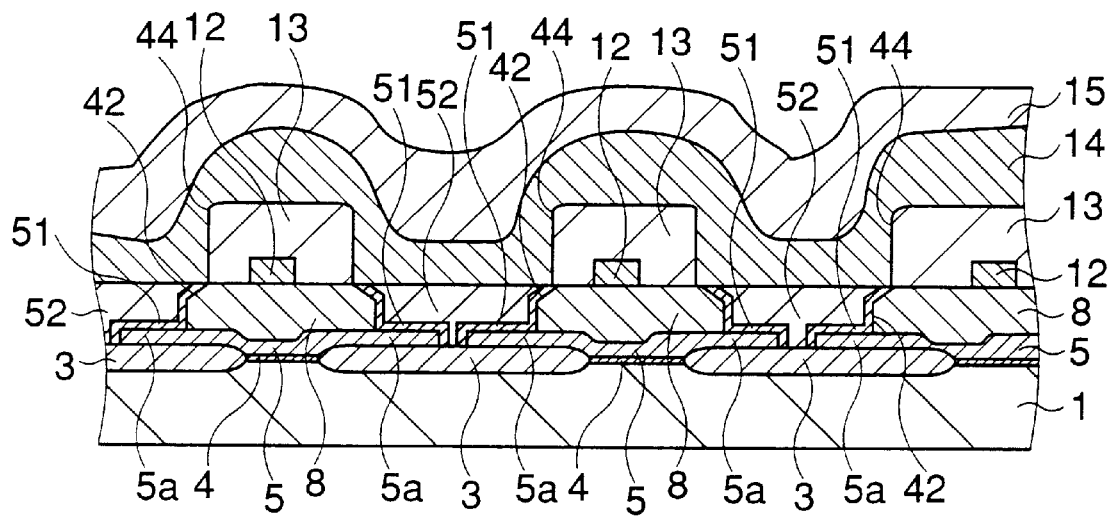
FIGS. 11A to 11C are schematic sectional views showing the memory cell region of an EEPROM according to the third embodiment of the present invention.
Figure 11B:
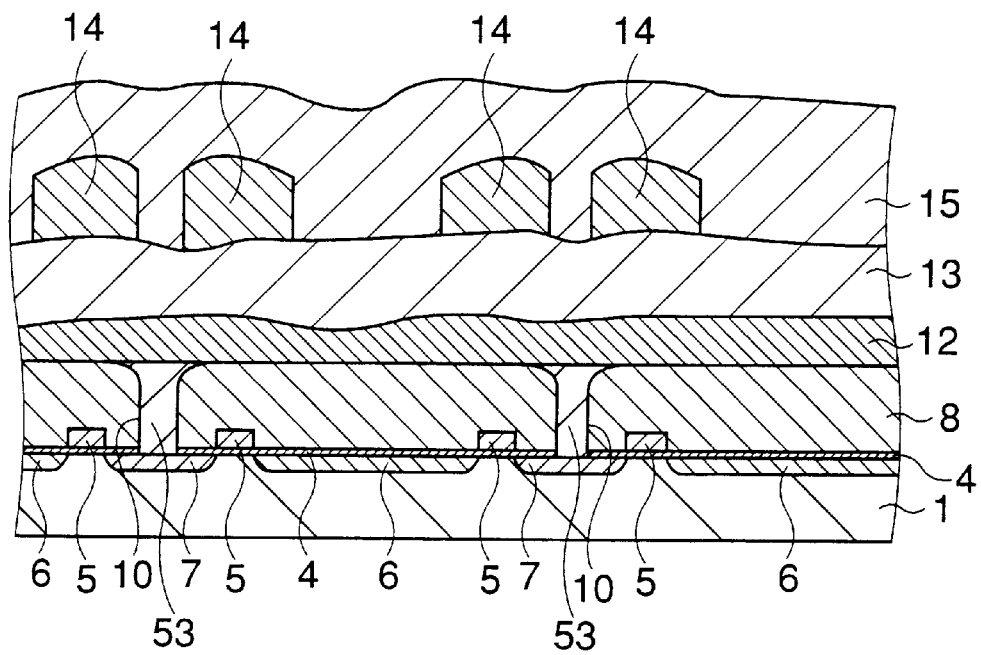
Figure 11C:
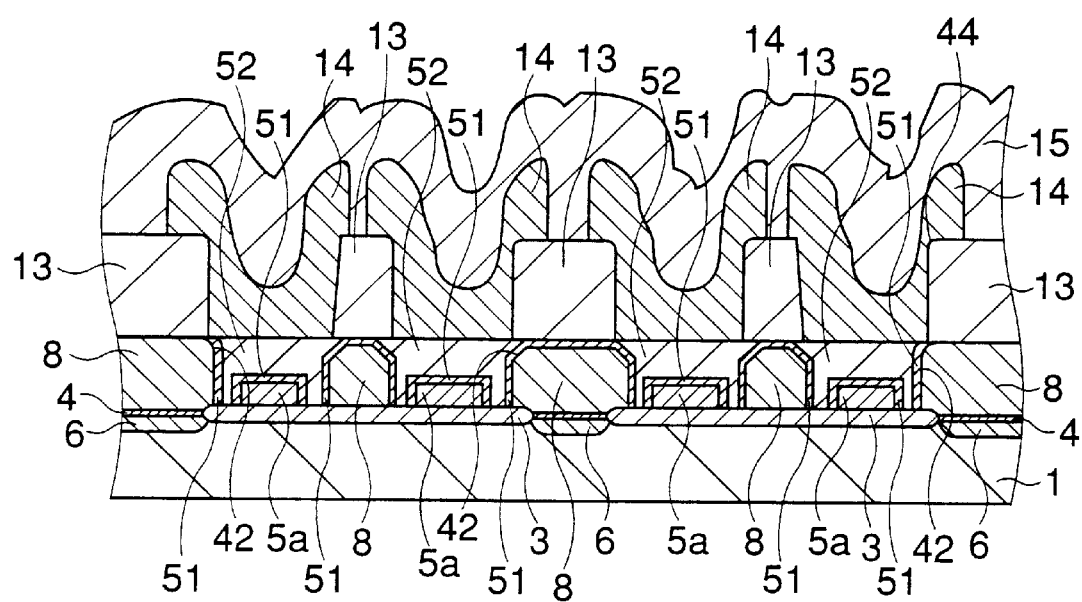

The EEPROM of the third embodiment has almost the same planar structure as that of the first embodiment shown in FIG. 1. FIG. 11A corresponds to a section taken along an alternate long and short dashed line A–A' in FIG. 1. FIG. 11B corresponds to a section taken along an alternate long and short dashed line B–B' in FIG. 1. FIG. 11C corresponds to a section taken along an alternate long and short dashed line C–C' in FIG. 1.

In the memory cell region of the EEPROM according to the third embodiment, a field oxide film 3 is formed in the surface region of a p-type silicon semiconductor substrate 1 to demarcate an element formation region 2. In this element formation region 2, a gate oxide film 4 is formed on the silicon semiconductor substrate 1. A floating gate electrode film 5 is formed on the gate oxide film 4 and the surface portions of the end portions of the adjacent field oxide films 3. A pair of impurity diffusion layers, i.e., a source diffusion layer 6 and a drain diffusion layer 7 are formed in the surface region of the silicon semiconductor substrate 1 in the element formation region 2. An insulating interlayer 8 is deposited on a portion of surface region of the floating gate electrode film 5. A contact hole 10 is formed in the insulating interlayer 8 to produce contact with the drain diffusion layer 7. An ONO film 51 is formed on the floating gate electrode film 5. A counterelectrode film 52 is formed on the ONO film 51 at a position opposing the floating gate electrode film 5. A contact plug 53 is formed to fill the contact hole 10. A first wiring layer 12 serving as a bit line is formed on the contact plug 53 to extend on the insulating interlayer 8. The first wiring layer 12 and the contact plug 53 are electrically connected. An insulating interlayer 13 is deposited on the first wiring layer 12. A second wiring layer 14 serving as a word line electrically connected to the counterelectrode film 52 is formed to be substantially perpendicular to the first wiring layer 12 with the insulating interlayer 13 intervened therebetween. A surface protective film 15 is deposited on the entire surface including the second wiring layer 14, thereby forming the memory cell region.

As shown in FIGS. 11A and 11C, the ONO film 51 covers the inner wall of an opening 42 formed in the insulating interlayer 8 and also covers the end portion 5a of the floating gate electrode film 5 in the opening 42.

The counterelectrode film 52 is formed to fill the opening 42 and cover the end portion 5a of the floating gate electrode film 5 in the opening 42 with the ONO film 51 intervened therebetween, as shown in FIG. 11C. As shown in FIG. 11A, the counterelectrode film 52 is formed under the second wiring layer 14 to oppose end portions 5a of the left and right floating gate electrode films 5 existing on the field oxide films 3 with the ONO film 51 intervened therebetween. The counterelectrode films 52 are electrically disconnected from each other by the insulating interlayer 8 above the field oxide film 3. One counterelectrode film 52 and two floating gate electrode films 5 (the end portions 5a of the floating gate electrode films 5) which are adjacent to each other and exist under the counterelectrode film 52 with the ONO film 51 intervened therebetween are capacitively coupled. The counterelectrode film 52 and the insulating interlayer 8 are planarized so that the surfaces thereof are almost flush with each other.

The contact plug 53 is formed to fill the contact hole 10 such that the surface of the contact plug 53 and the surface of the insulating interlayer 8 are almost flush with each other. This contact plug 53 is simultaneously formed together with the counterelectrode film 52 using the same material.

The first wiring layer 12 is formed on the planarized insulating interlayer 8 by patterning a polysilicon film into a strip shape. As shown in FIG. 11A, the first wiring layer 12 extends substantially perpendicular to the longitudinal direction of the floating gate electrode film 5 with the insulating interlayer 8 intervened therebetween substantially at the central portion of the floating gate electrode film 5 along the longitudinal direction. As shown in FIG. 11B, the first wiring layer 12 extends on the insulating interlayer 8 and is connected to the contact plugs 53 filled in the contact holes 10 arranged in the row direction in FIG. 1.

In this EEPROM, on the field oxide film 3 as an element isolation structure, the counterelectrode film 52, i.e., the second wiring layer 14 serving as a word line and two floating gate electrode films 5 (the end portions 5a of the floating gate electrode films 5) which are adjacent to each other on the field oxide film 3 are capacitively coupled, as described above. Therefore, in the operation of the EEPROM, a predetermined voltage is applied to a desired first wiring layer 12 serving as a bit line to apply the voltage to the drain diffusion layers 7 electrically connected to the first wiring layer 12 through the contact holes 10 arranged in the row direction. At the same time, a predetermined voltage is applied to a desired second wiring layer 14 serving as a word line to apply predetermined charges to the opposing floating gate electrode films 5 (the end portions 5a of the floating gate electrode films 5) from the counterelectrode films 52 arranged in the column direction and electrically connected to the second wiring layer 14. With this operation, a desired unit memory cell M is uniquely selected.

As described above, according to the EEPROM of the third embodiment, the first wiring layers 12 serving as bit lines and the second wiring layers 14 serving as word lines are stacked to cross each other with the insulating interlayer 13 intervened therebetween, and the first wiring layers 12 are formed under the second wiring layers 14, as in the first embodiment. Therefore, the contact hole 10 formed to obtain bit contact can be made shallow, i.e., formed to a depth with substantially the same value as that of the thickness of the single insulating interlayer 8 formed on the surface of the silicon semiconductor substrate 1 while ensuring a normal EEPROM operation. With this structure, the aspect ratio of the contact hole 10 can be made low to further decrease the hole diameter.

In addition, according to this EEPROM, the second wiring layer 14 serving as a word line is made of a metal layer. The word line has a much smaller electrical resistance value than one made of a polysilicon film in silicon process. Since the electrical resistance value need not be decreased by forming a back wiring layer or the like, the number of processes decreases.

Furthermore, according to the EEPROM, the counterelectrode film 52 covers, with the ONO film 51 intervened, two floating gate electrode films 5 adjacent to each other on the field oxide film 3, and is arranged to oppose the end portions 5a of these floating gate electrode films 5. More specifically, the counterelectrode film 52 is capacitively coupled not only to the upper surfaces of the floating gate electrode films 5 but also to part of the side surfaces of the floating gate electrode films 5, as shown in FIG. 11C. The counterelectrode film 52 is also capacitively coupled to the end portions 5a of the two floating gate electrode films 5, as shown in FIG. 11A. With this structure, a high capacitive coupling ratio can be obtained.

Still further, according to the EEPROM, surfaces of the insulating interlayer 8 and the counterelectrode film 52 are planarized so that the surface of the insulating interlayer 8 is substantially flush with the counterelectrode film 52. Therefore, the overlaying first wiring layer 12 and the second wiring layer 14 are formed free from generation of undesirable steps. The EEPROM is thus kept from failure such as breaking of wires, allowing it to be further micro-sized.

Fourth Embodiment

The fourth embodiment of the present invention will be described below. In the fourth embodiment, a method of manufacturing a logic LSI which has EFPROM memory cell regions and memory cell peripheral circuit regions will be exemplified, as in the second embodiment. The method of manufacturing the logic LSI according to the fourth embodiment is different from that of the second embodiment mainly in the technique of forming the counterelectrode film. The same reference numerals as in FIGS. 11A to 11C of the third embodiment denote the same parts in the fourth embodiment, and a detailed description thereof will be omitted.

Figure 12A:
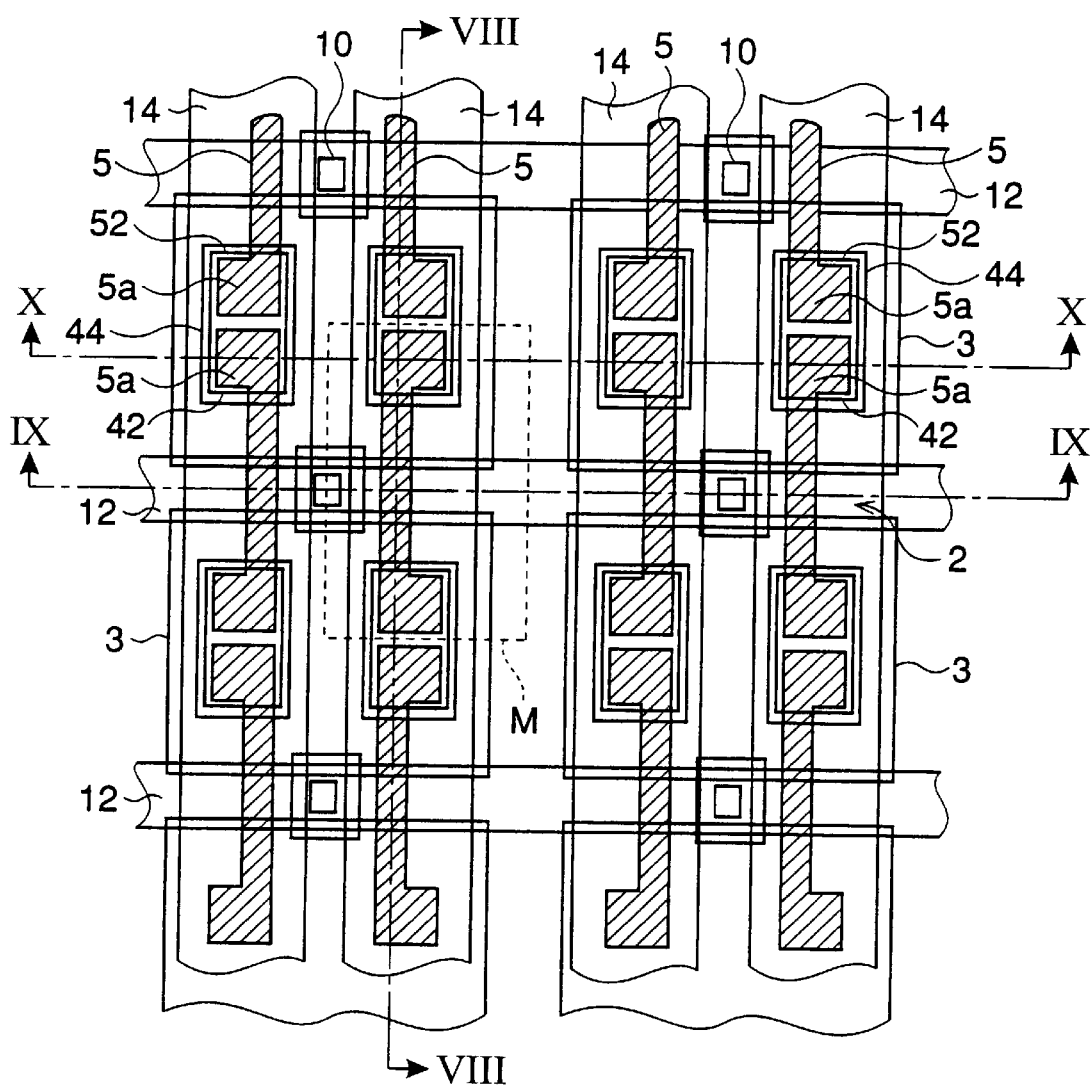
FIGS. 12A and 12B are schematic plan views showing the memory cell region and its peripheral circuit region of a logic LSI manufactured in the fourth embodiment of the present invention.
Figure 12B:
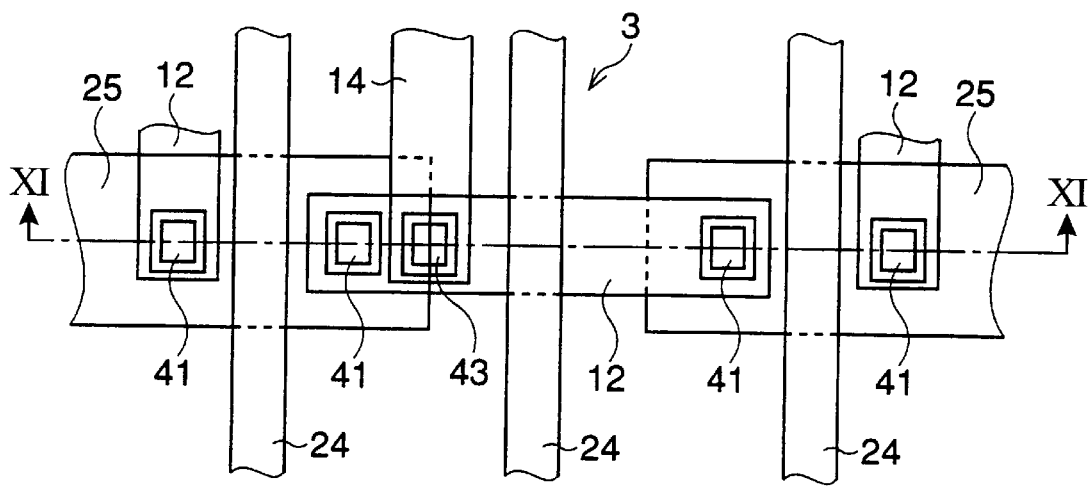
Figure 13A:
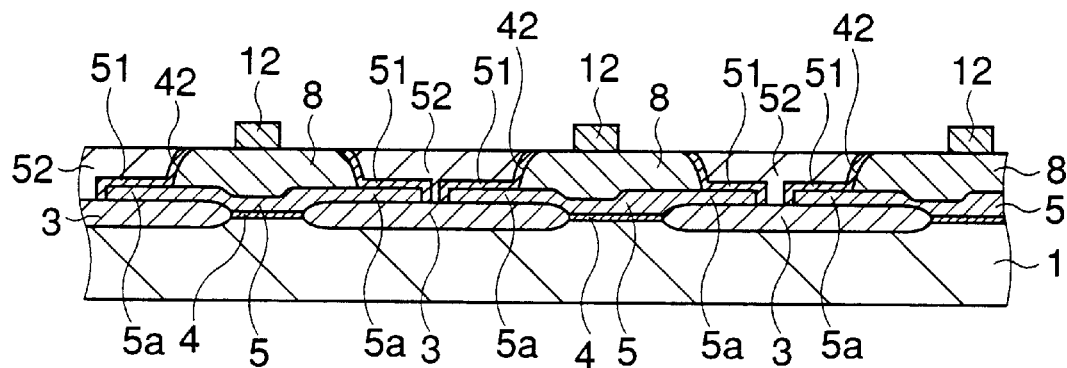
FIGS. 13A to 13D are schematic sectional views showing steps in manufacturing the logic LSI according to the fourth embodiment of the present invention.
Figure 13B:
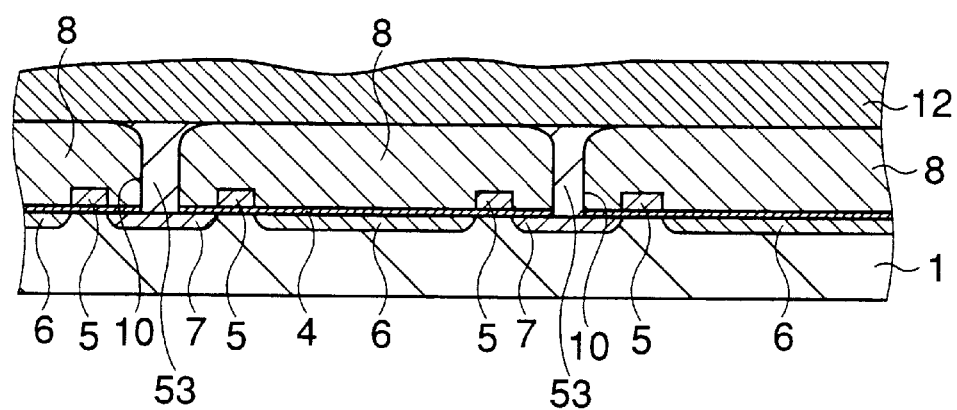
Figure 13C:
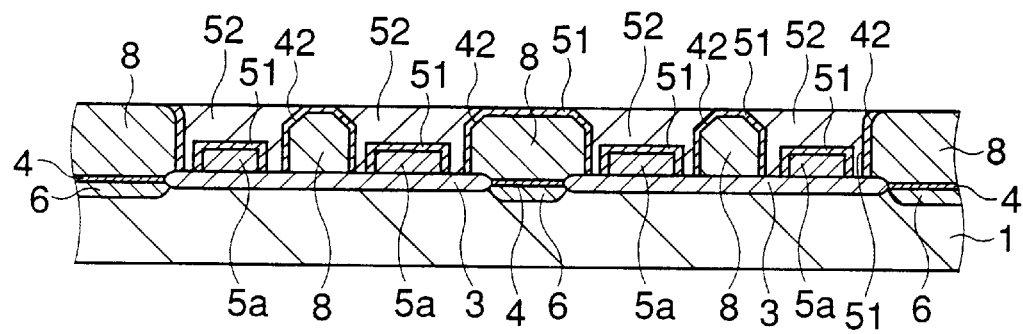
Figure 13D:
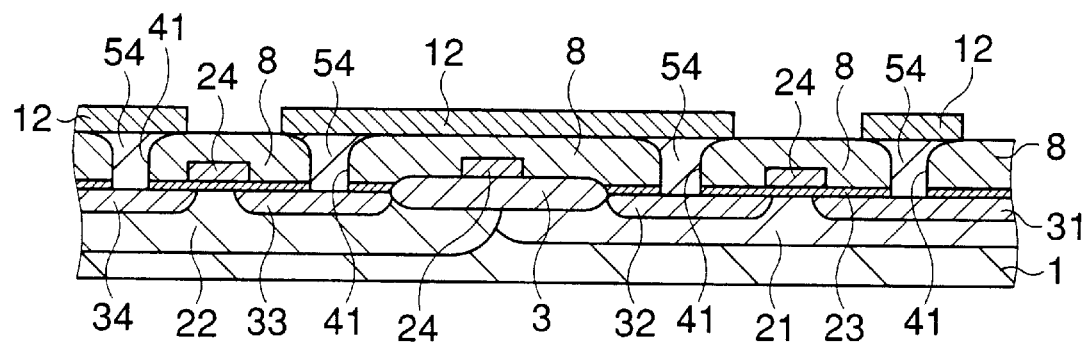
Figure 14A:
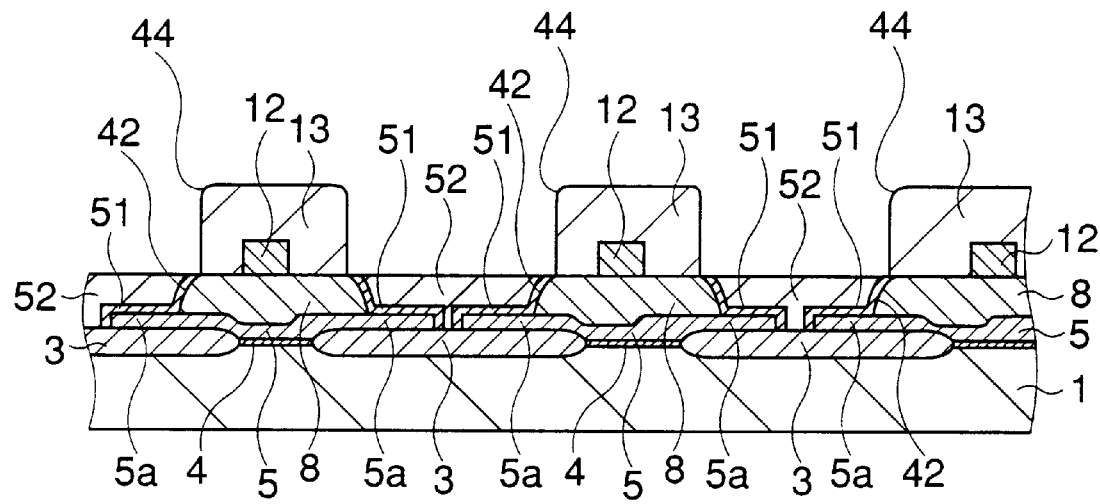
FIGS. 14A to 14D are schematic sectional views showing steps in manufacturing the logic LSI according to the fourth embodiment of the present invention.
Figure 14B:
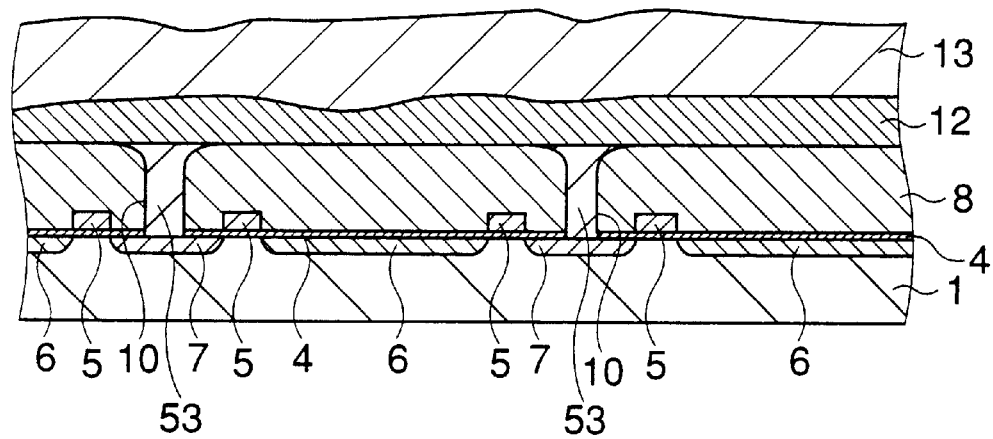
Figure 14C:
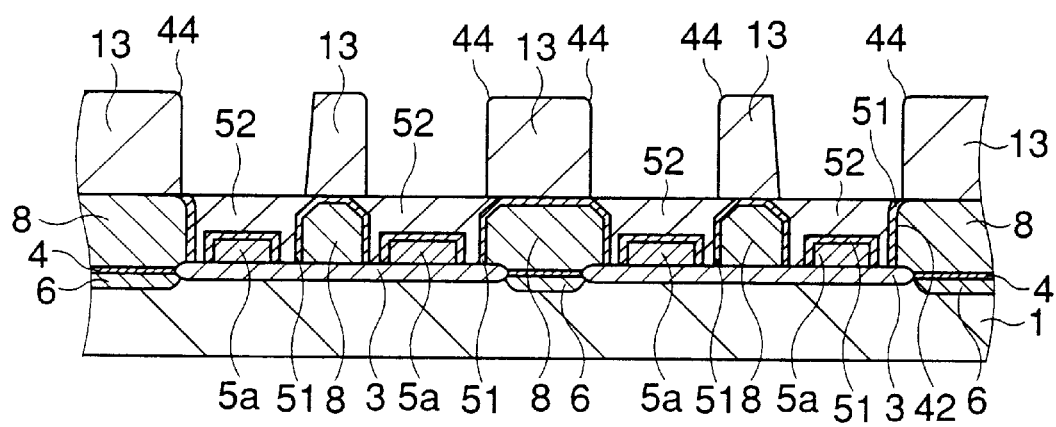
Figure 14D:
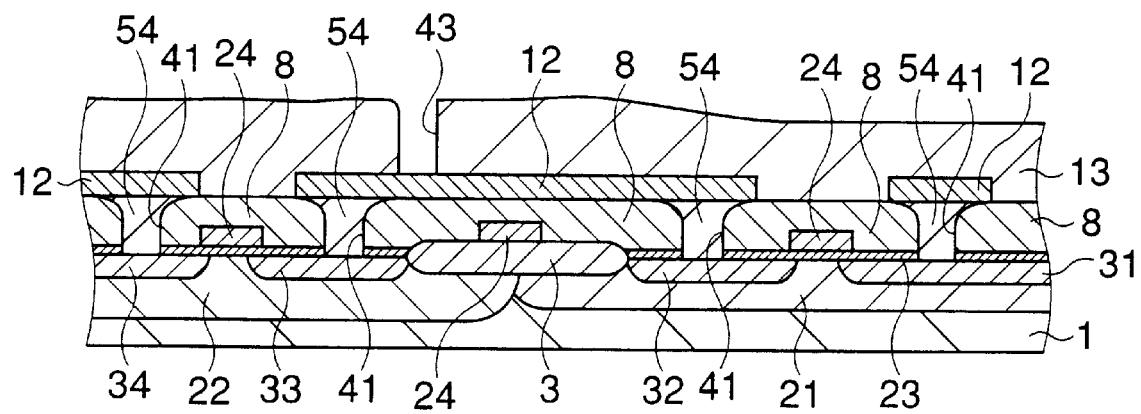
Figure 15A:
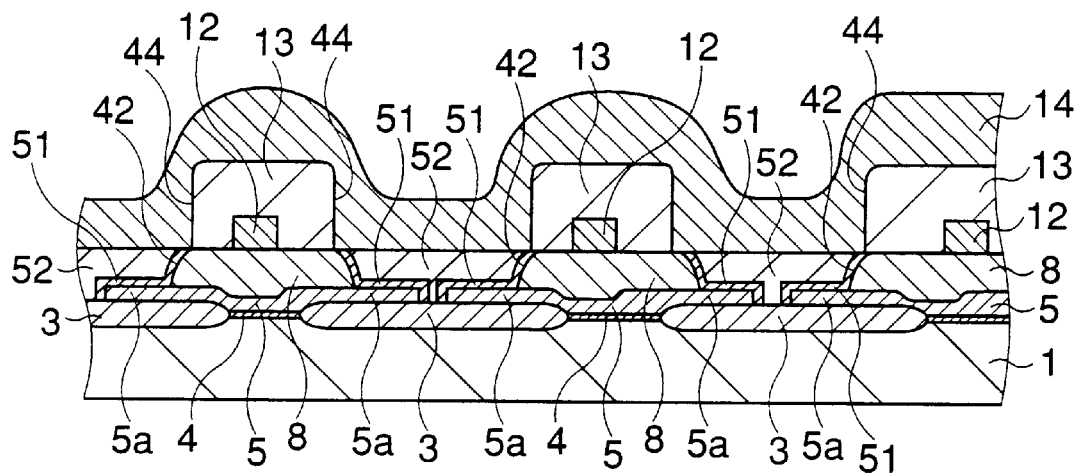
FIGS. 15A to 15D are schematic sectional views showing steps in manufacturing the logic LSI according to the fourth embodiment of the present invention.
Figure 15B:
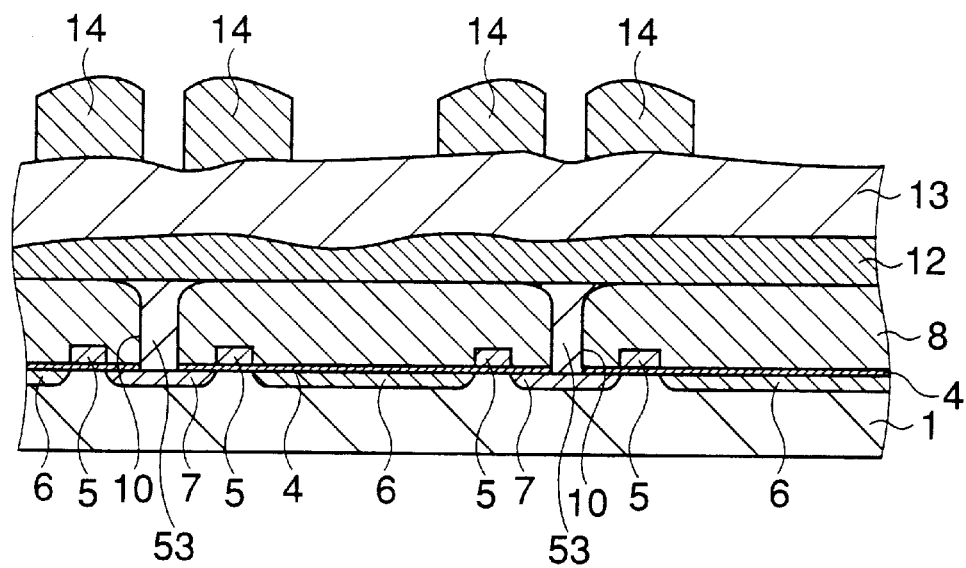
Figure 15C:
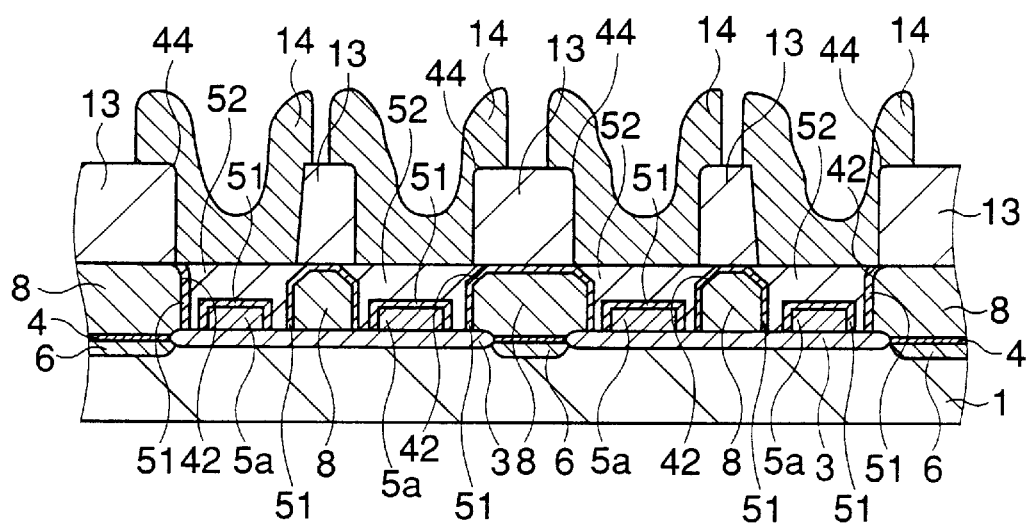
Figure 15D:
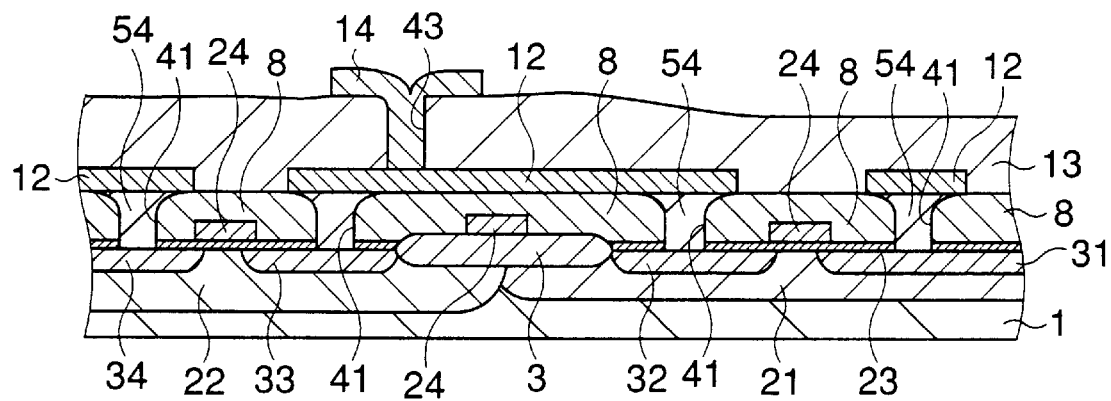

FIGS. 12A and 12B are schematic plan views showing the memory cell region and peripheral circuit region of the logic LSI. FIG. 12A corresponds to the memory cell region, and FIG. 12B corresponds to the peripheral circuit region. FIGS. 13A, 14A, and 15A correspond to a section taken along an alternate long and short dashed line A–A' in FIG. 12A. FIGS. 13B, 14B, and 15B correspond to a section taken along an alternate long and short dashed line B–B' in FIG. 12A. FIGS. 13C, 14C, and 15C correspond to a section taken along an alternate long and short dashed line C–C' in FIG. 12A. FIGS. 13D, 14D, and 15D correspond to a section taken along an alternate long and short dashed line D–D' in FIG. 12B.

As in the second embodiment, with the processes shown in FIGS. 4A to 4D to FIGS. 7A to 7D, in the memory cell region, an opening 42 and a contact hole 10 are formed in an insulating interlayer 8. In the peripheral circuit region, contact holes 41 are formed in the insulating interlayer 8. Subsequently, a silicon oxide film, a silicon nitride film, and a silicon oxide film are sequentially formed on the entire surface to form an ONO film 51 such that the thickness becomes 150 to 300 Å in conversion to the oxide film capacitance.

As shown in FIGS. 13A to 13D, on the memory cell region side, a counterelectrode film 52 opposing the floating gate electrode film 5 with the ONO film 51 intervened therebetween is formed to fill the opening 42 formed in the insulating interlayer 8, and a contact plug 53 is formed to fill the contact hole 10 formed in the insulating interlayer 8. On the peripheral circuit region side, a contact plug 54 is formed to fill the contact hole 41 formed in the insulating interlayer 8. Next, a first wiring layer 12 is patterned on the insulating interlayer 8 on both the memory cell region side and the peripheral circuit region side.

More specifically, the ONO films 51 deposited in the contact hole 10 in the memory cell region and the contact hole 41 in the peripheral circuit region are removed first. A polysilicon film is deposited on the entire surface including the contact hole 10 and the opening 42 (on the upper surface of the ONO film 51 formed in the opening 42) in the memory cell region and the contact hole 41 in the peripheral circuit region by vacuum deposition such as CVD.

The polysilicon film is planarized by chemical-mechanical polishing (CMP) using the insulating interlayer 8 as a stopper. At this time, in the memory cell region, the polysilicon film on the insulating interlayer 8 is removed for forming the counterelectrode film 52 to fill the opening 42, and the contact plug 53 to fill the contact hole 10. In the peripheral circuit region, the polysilicon film on the insulating interlayer 8 is removed for forming the contact plug 54 to fill the contact hole 41. The insulating interlayer 8, the counterelectrode film 52, and the contact plugs 53 and 54 are planarized so that the surfaces of these layers are almost flush with each other. Instead of CMP, anisotropic etching may be used to planarize the surface of the polysilicon film using the insulating interlayer 8 as a stopper.

Next, a polysilicon film is deposited on the entire surface including the upper surface of the contact plug 53 in the memory cell region and the upper surface of the contact plug 54 in the peripheral circuit region by vacuum deposition such as CVD.

The polysilicon film is subjected to photolithography and dry etching to simultaneously form the first wiring layers 12 electrically connected to the contact plugs 53 and 54 in the memory cell region and the peripheral circuit region.

As shown in FIGS. 14A to 14D, a silicon oxide film is deposited on the entire surface by, e.g., plasma CVD to form an insulating interlayer 13. The insulating interlayer 13 is planarized by chemical-mechanical polishing (CMP) and patterned by photolithography and dry etching.

More specifically, in the memory cell region, an opening 44 is formed in the surface-planarized insulating interlayer 13 to expose the surface portion of the counterelectrode film 52, as shown in FIG. 14A. In the peripheral circuit region, a contact hole 43 is formed in the surface-planarized insulating interlayer 13 to expose the surface portion of the first wiring layer 12 which is electrically connected to drain diffusion layers 32 and 33 of nMOS and pMOS transistors, as shown in FIG. 14D.

The insulating interlayer 13 may be formed in the following manner. A silicon oxide film is deposited on the entire surface by, e.g., plasma CVD, and an SOG (Spin On Glass) is applied. The entire surface is etched back, and a silicon oxide film is deposited on the entire surface by plasma CVD again, thereby forming the insulating interlayer 13.

Subsequently, as shown in FIGS. 15A to 15D, a metal film of, e.g., an aluminum alloy is formed on the entire surface of the silicon semiconductor substrate 1 in the memory cell region and the peripheral circuit region by sputtering or the like. This metal film is patterned by photolithography and dry etching to form a second wiring layer 14 in the memory cell region and the peripheral circuit region.

More specifically, in the memory cell region, as shown in FIGS. 15A and 15B, in order to form the second wiring layer 14 serving as a word line, the metal film is formed into a shape such that the second wiring layer 14 extends on the insulating interlayer 13 covering the first wiring layer 12 and the counterelectrode film 52 exposed to the bottom portion in the opening 44 and is formed above the floating gate electrode film 5 to be substantially parallel to the longitudinal direction of the floating gate electrode film 5, i.e., substantially perpendicular to the first wiring layer 12. At this time, the second wiring layer 14 is electrically disconnected from the first wiring layer 12 by the insulating interlayer 13 and electrically connected to the counterelectrode film 52 so that the second wiring layer 14 serves as a control gate for the floating gate electrode film 5.

In the peripheral circuit region, as shown in FIG. 15D, the metal film deposited on the insulating interlayer 13 to fill the contact hole 43 is patterned to form the second wiring layer 14 which is electrically connected to the first wiring layer 12 through the contact hole 43.

The second wiring layer 14 may be formed in the following manner. A polysilicon film doped with, e.g., phosphorus (P) or a metal thin film made of, e.g., tungsten is deposited on the entire surface. The polysilicon film on the insulating interlayer 13 is removed by a planarization process such as etch back or CMP to form the contact plugs in the opening 44 formed in the insulating interlayer 13 in the memory cell region and in the contact hole 43 formed in the insulating interlayer 13 in the peripheral circuit region. Thereafter, a metal film of, e.g., an aluminum alloy is formed on the entire surface and patterned, thereby forming the second wiring layer 14 electrically connected to the contact plugs.

Thereafter, as shown in FIG. 11A, a surface protective film 15 consisting of a silicon oxide film or the like is formed on the entire surface of the silicon semiconductor substrate 1 in the memory cell region and the peripheral circuit region by, e.g., CVD, thereby completing the logic LSI of the fourth embodiment.

The output terminal of a decoder belonging to the peripheral circuit region is connected to the drain diffusion layers 32 and 33 of the pMOS and nMOS transistors in the peripheral circuit region. The output terminal is also connected to the drain diffusion layer 7 of the memory cell transistor in the memory cell region through the second wiring layer 14.

As described above, according to the method of manufacturing the logic LSI of the fourth embodiment, in formation of the polysilicon film as the counterelectrode film 52 and the contact plug 53 in the memory cell region, simultaneously, the polysilicon film is also deposited on the insulating interlayer 8 including the contact holes 41 in the peripheral circuit region and planarized to form the contact plug 54 which is electrically connected to the source diffusion layers 31 and 34 and the drain diffusion layers 32 and 33. In formation of the polysilicon film as the first wiring layer 12 in the memory cell region, simultaneously, the polysilicon film is also deposited on the insulating interlayer 8 in the peripheral circuit region and patterned into the first wiring layer 12. Therefore, the process of forming the control gate electrode film which is not present in the peripheral circuit region while masking the peripheral circuit region is omitted, so that the photolithography process is omitted to simplify the manufacturing process.

According to this manufacturing method, surfaces of the insulating interlayer 8 and the counterelectrode film 52 are planarized so that the surface of the insulating interlayer 8 is substantially flush with the counterelectrode film 52.

Therefore, the overlaying first wiring layer 12 and the second wiring layer 14 are formed plainly free from generation of undesirable steps. Failure such as breaking of wires is prevented, allowing the device to be further microsized.

According to this manufacturing method, on the field oxide film 3, the counterelectrode film 52 is formed to oppose, with the ONO film 51 intervened, the end portions 5a of two floating gate electrode films 5 adjacent to each other. In formation of the floating gate electrode film 5 in the opening 42, even when the opening 42 and the floating gate electrode film 5 are shifted in the left or right direction in micropatterning, the overlapping area of the opening 42 and the floating gate electrode film 5 maintains a predetermined value relative to that of an adjacent unit memory cell M, so no difference in capacitive coupling ratio is generated between the unit memory cells M. More specifically, the positioning accuracy between the opening 42 and the floating gate electrode film 5 can be relaxed, while a desired predetermined capacitive coupling ratio is achieved.

In addition, according to this manufacturing method, the second wiring layer 14 and the counterelectrode film 52 are formed to overlap the floating gate electrode film 5 on the field oxide film 3 with the ONO film 51 intervened therebetween. Therefore, simply by adding several processes to the conventional standard logic LSI process, an EEPROM memory cell can be easily formed without complicating the manufacturing process.

The counterelectrode film 52 is formed to cover the floating gate electrode film 5 from its upper surface to part of the side surface with the ONO film 51 intervened therebetween. In this structure, the opposing area between the counterelectrode film 52 and the floating gate electrode film 5 increases as compared to a structure in which the counterelectrode film 52 is simply formed above the floating gate electrode film 5. Therefore, the capacitive coupling ratio between the electrode films 5 and 52 can be increased as compared to the structure in which the counterelectrode film 52 is simply formed above the floating gate electrode film 5, although the memory size is kept unchanged. When the same voltage is applied to the drain diffusion layer 7 or the counterelectrode film 52 (i.e., the second wiring layer 14 serving as a word line), a large electric field is applied to the gate oxide film 4.

More specifically, in, e.g., writing, the source diffusion layer 6 and the silicon semiconductor substrate 1 are set at a ground potential. A voltage of 5 V is applied to the drain diffusion layer 7, and thermions generated from the end portion of the drain diffusion layer 7 are injected into the floating gate electrode film 5. In this case, the voltage to be applied to the counterelectrode film 52 can be lowered. For example, when the word line is simply formed above the floating gate electrode film, a voltage of 12 V must be applied to the counterelectrode film 11. In this embodiment, this voltage can be lowered to 6 to 7 V.

In the case that a tunnel oxide film is formed in place of the gate oxide film 4, when the word line is simply formed above the floating gate electrode film, a voltage of 14 V must be applied to the drain diffusion layer. In this embodiment, however, a similar rewrite operation can be performed with an applied voltage of 11 V, although the memory size is kept unchanged.

An EEPROM as a semiconductor storage device is exemplified in the first and second embodiments. However, the semiconductor storage device can be applied to an MNOS transistor in which an electric charge accumulation layer is made of a two-layer film (NO film) constituted by a nitride film and an oxide film in place of an floating gate electrode film, an MONOS transistor in which an electric charge accumulation layer is made of a three-layer film (ONO film) constituted by an oxide film, a nitride film and an oxide film in place of an floating gate electrode film, an EPROM, a PROM, or the like.

As has been described above, according to the semiconductor device of the present invention, in a nonvolatile semiconductor memory such as a floating gate type EEPROM, the bit lines are formed under the word lines so that the bit lines and the word lines cross each other with the insulating film intervened therebetween. This structure can cope with further micropatterning and higher integration because bit contact can be easily and properly obtained.

According to the method of manufacturing the semiconductor device of the present invention, when a logic LSI incorporating a nonvolatile semiconductor memory such as a floating gate type EEPROM is to be manufactured, bit contact can be easily and properly obtained with a structure capable of coping with further micropatterning and higher integration. In addition, the memory cell region having the composite structure of the floating gate and the control gate and the peripheral circuit region having the single gate structure can be manufactured with relatively good uniformity. Since the number of manufacturing processes decreases, an increase in manufacturing cost can be prevented, and a reliable semiconductor device can be realized.

What is claimed is:

1. A semiconductor device comprising:
   a first insulating film formed on a surface of a semiconductor substrate in an element formation region demarcated on said semiconductor substrate;
   a floating gate electrode patterned at least on said first insulating film in said element formation region;
   a second insulating film formed on said floating gate electrode and having an opening for exposing part of a surface of said floating gate electrode;
   a third insulating film covering at least said exposed surface of said floating gate electrode;
   a counterelectrode patterned to bury the opening, opposing said floating gate electrode, and capacitively coupled to said floating gate electrode with said third insulating film intervened therebetween;
   a first wiring layer formed on said second insulating film at a level corresponding to said counterelectrode and substantially consisting of the same material as that of said counterelectrode;
   a fourth insulating film formed to cover said first wiring layer and electrically disconnect said first wiring layer from said adjacent counterelectrode; and
   a second wiring layer stacked on said fourth insulating film and said counterelectrode to cross said first wiring layer with said fourth insulating film intervened therebetween and electrically connected to said counterelectrode.

2. A device according to claim 1, further comprising
   an element isolation structure formed on said semiconductor substrate to demarcate said element formation region, and
   wherein said floating gate electrode is formed on two adjacent element isolation structures and said first insulating film to extend across said first insulating film between two adjacent element isolation structures and capacitively coupled to said counterelectrode with said third insulating film intervened therebetween on said element isolation structure, and said second wiring layer is electrically connected to said counterelectrode on said element isolation structure.

3. A device according to claim 2, wherein said counterelectrode is formed to cover said floating gate electrode with said third insulating film intervened therebetween and capacitively coupled to two adjacent floating gate electrodes on said element isolation structure.

4. A device according to claim 1, wherein said floating gate electrode is a film substantially made of at least one material selected from the group consisting of silicon, ruthenium dioxide, vanadium oxide, and indium oxide.

5. A device according to claim 1, wherein said second wiring layer is a metal film.

6. A semiconductor device comprising:
a first insulating film formed on a surface of a semiconductor substrate in an element formation region demarcated on said semiconductor substrate;
a floating gate electrode patterned at least on said first insulating film in said element formation region;
a second insulating film formed on said floating gate electrode and having an opening for exposing part of a surface of said floating gate electrode;
a third insulating film covering at least said exposed surface of said floating gate electrode;
a counterelectrode filling in the opening, opposing said floating gate electrode, and capacitively coupled to said floating gate electrode with said third insulating film intervened therebetween;
a first wiring layer patterned on said second insulating film;
a fourth insulating film formed to cover said first wiring layer and electrically disconnect said first wiring layer from said adjacent counterelectrode; and
a second wiring layer stacked on said fourth insulating film and said counierelectrode to cross said first wiring layer with said fourth insulating film intervened therebetween and electrically connected to said counterelectrode.

7. A device according to claim 6, wherein a surface of said second insulating film and a surface of said counterelectrode are substantially flush with each other.

8. A device according to claim 6, further comprising
an element isolation structure formed on said semiconductor substrate to demarcate said element formation region, and
wherein said floating gate electrode is formed on two adjacent element isolation structures and said first insulating film to extend across said first insulating film between two adjacent element isolation structures and capacitively coupled to said counterelectrode with said third insulating film intervened therebetween on said element isolation structure, and said second wiring layer is electrically connected to said counterelectrode on said element isolation structure.

9. A device according to claim 8, wherein said counterelectrode is formed to cover said floating gate electrode with said third insulating film intervened therebetween and capacitively coupled to two adjacent floating gate electrodes on said element isolation structure.

10. A device according to claim 6, wherein said floating gate electrode is a film substantially made of at least one material selected from the group consisting of silicon, ruthenium dioxide, vanadium oxide, and indium oxide.

11. A device according to claim 6, wherein said second wiring layer is a metal film.

12. A device according to claim 6, wherein said first wiring layer serves as a bit line.

13. A semiconductor device comprising:
a first conductive film patterned on a semiconductor substrate at least with a first insulating film intervened therebetween;
a second conductive film patterned on said first conductive film with a second insulating film intervened therebetween and capacitively coupled to said first conductive film;
a third conductive film patterned on said first conductive film at least with a third insulating film intervened therebetween and buried in a fourth insulating film to be close to said second conductive film with said fourth insulating film intervened therebetween; and
a fourth conductive film patterned on said second conductive film and said fourth insulating film, electrically connected to said second conductive film, and crossing said third conductive film with said fourth insulating film intervened therebetween.

14. A device according to claim 13, further comprising
a pair of impurity diffusion layers formed in a surface region of said semiconductor substrate, and
wherein said third conductive film is electrically connected to one of said impurity diffusion layers through an opening formed in said third insulating film.

15. A device according to claim 13, further comprising
an element isolation structure formed on said semiconductor substrate to demarcate an element formation region, and
wherein said first conductive film is formed on two adjacent element isolation structures and said first insulating film to extend across said first insulating film between two adjacent element isolation structures and is capacitively coupled to said second conductive film with said second insulating film intervened therebetween on said element isolation structure.

16. A device according to claim 13, wherein said second and third conductive films are patterned from the same conductive film on said third insulating film and separated from each other.

17. A device according to claim 13, wherein said second conductive film is formed to fill an opening formed in said third insulating film on said first conductive film and oppose said first conductive film with said second insulating film intervened therebetween, and
said third conductive film is formed on said third insulating film at a level different from that of said second conductive film.

18. A device according to claim 17, wherein a surface of said third insulating film and a surface of said second conductive film are substantially flush with each other.

19. A device according to claim 13, wherein said first conductive film is a film substantially made of at least one material selected from the group consisting of silicon, ruthenium dioxide, vanadium oxide, and indium oxide.

20. A device according to claim 13, wherein said fourth conductive film is a metal film.

21. A device according to claim 13, wherein said third conductive film serves as a bit line.

22. A semiconductor device having an element isolation structure formed in an element isolation region on a semiconductor substrate to demarcate an element formation region, comprising:

in said element formation region,
an electric charge accumulation layer patterned over said semiconductor substrate,
a pair of impurity diffusion layers formed in said semiconductor substrate to serve as source and drain,
a first insulating interlayer formed over said semiconductor substrate including said electric charge accumulation layer and having a first opening, at least part of a bottom of the first opening being a surface of one of said pair of impurity diffusion layers,
a bit line connected to one of said pair of impurity diffusion layers in the first opening;

in said element isolation region,
an extension portion extending over said element isolation structure, said electric charge accumulation layer formed in said element formation region having said extension portion, said first insulating interlayer having a second opening at least part of which is formed on said extension portion formed on said element isolation structure;

in the second opening,
a control gate electrode formed in the second opening formed in at least said first insulating interlayer to oppose said extension portion;
a second insulating interlayer formed over said bit line and said first insulating layer, said second insulating interlayer having a third opening at least part of which is formed on said control gate electrode; and in the third opening,
a word line connected to said control gate electrode and formed to extend over said second insulating interlayer across said bit line with said second insulating interlayer intervened between said word line and bit line.

23. A device according to claim 22, wherein said element isolation structure has a field shield electrode for element isolation.

24. A device according to claim 22, wherein said element isolation structure is made of an insulating film for element isolation.

25. A device according to claim 22, wherein said electric charge accumulation layer having said extension portion is a floating gate electrode, said device further comprising:
in said element formation region,
an insulating film formed on said semiconductor substrate, said floating gate electrode being formed on said insulating film; and
in the second opening,
a dielectric film formed on at least a surface of said extension portion in the second opening, said control gate electrode being formed oppose to said extension portion with said dielectric film intervened therebetween.

26. A device according to claim 25, wherein, in the second opening, said control gate electrode is formed to cover said extension portion with said dielectric film intervened therebetween and capacitively coupled to said extension portion.

27. A device according to claim 22, wherein said electric charge accumulation layer having said extension portion is a film substantially made of at least one material selected from the group consisting of silicon, ruthenium dioxide, vanadium oxide, indium oxide, and multilayer including an oxide film and a nitride film.

28. A device according to claim 25, wherein said electric charge accumulation layer having said extension portion is a film substantially made of at least one material selected from the group consisting of silicon, ruthenium dioxide, vanadium oxide, indium oxide, and multilayer including an oxide film and a nitride film.

29. A device according to claim 25, wherein said dielectric film is a ferroelectric film.

30. A device according to claim 22, wherein said semiconductor device includes at least one of an MNOS, an MONOS, an EEPROM, an EPROM, and a PROM.

31. A device according to claim 25, wherein said semiconductor device includes at least one of an MNOS, an MONOS, an EEPROM, an EPROM, and a PROM.

32. A device according to claim 22, wherein said semiconductor device is a multivalued semiconductor memory which stores one of predetermined multivalued data of not less than ternary.

33. A device according to claim 32, wherein said multivalued semiconductor memory includes at least one of a multivalued EEPROM, a multivalued EPROM, a multivalued PROM, a multivalued MNOS, and a multivalued MONOS.

34. A device according to claim 25, wherein said semiconductor device is a multivalued semiconductor memory which stores one of predetermined multivalued data of not less than ternary.

35. A device according to claim 34, wherein said multivalued semiconductor memory includes at least one of a multivalued EEPROM, a multivalued EPROM, a multivalued PROM, a mullivalued MNOS, and a multivalued MONOS.

36. A device according to claim 1, wherein said first wiring layer serves as a bit line.

* * * * *

UNITED STATES PATENT AND TRADEMARK OFFICE
CERTIFICATE OF CORRECTION

PATENT NO. : 5,900,661
DATED : May 4, 1999
INVENTOR(S): YASUO SATO

It is certified that error appears in the above-identified patent and that said Letters Patent is hereby corrected as shown below:

Column 4, line 25, change "oppose to --to oppose--.

Column 5, line 65, change "A - A'" with --I - I--.
    line 67, change "B - B'" with --II - II--.

Column 6, line 2, change "C - C'" with --III - III--.

Column 9, line 13, change "A - A'" with --IV - IV--.
    line 16, change "B - B'" with --V - V--.
    line 18, change "C - C'" with --VI - VI--.
    line 20, replace "D - D'" with --VII - VII--.

Column 14, line 21, change "A - A'" with --I - I--.
    line 23, replace "B - B'" with --II - II--.
    line 25, replace "C - C'" with --III - III--.

Column 16, line 43, change "A - A'" with --VIII - VIII--.
    line 45, replace "B - B'" with --IX - IX--.
    line 47, replace "C - C'" with --X - X--.
    line 49, replace "D - D'" with --XI - XI--.

Signed and Sealed this

Ninth Day of November, 1999

Q. TODD DICKINSON

Attest:

Attesting Officer

Acting Commissioner of Patents and Trademarks